(12) United States Patent
Takahashi

(10) Patent No.: US 7,719,103 B2
(45) Date of Patent: May 18, 2010

(54) SEMICONDUCTOR DEVICE

(75) Inventor: Hidekazu Takahashi, Isehara (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 945 days.

(21) Appl. No.: 11/449,696

(22) Filed: Jun. 9, 2006

(65) Prior Publication Data
US 2007/0001226 A1    Jan. 4, 2007

(30) Foreign Application Priority Data
Jun. 30, 2005  (JP) .............................. 2005-191367

(51) Int. Cl.
*H01L 23/04* (2006.01)
(52) U.S. Cl. ................. 257/698; 257/E23.024
(58) Field of Classification Search ............... 257/698, 257/E23.024
See application file for complete search history.

(56) References Cited

U.S. PATENT DOCUMENTS

| 6,331,722 | B1 | 12/2001 | Yamazaki et al. |
| 6,682,963 | B2 | 1/2004 | Ishikawa |
| 6,970,362 | B1 * | 11/2005 | Chakravorty ......... 257/E23.079 |
| 7,030,651 | B2 * | 4/2006 | Madurawe ................... 257/202 |
| 7,387,949 | B2 * | 6/2008 | Fukazawa ................... 438/460 |
| 2004/0124542 | A1 | 7/2004 | Kuwabara et al. |
| 2004/0140547 | A1 | 7/2004 | Yamazaki et al. |
| 2004/0164302 | A1 | 8/2004 | Arai et al. |
| 2004/0212012 | A1 | 10/2004 | Yamazaki et al. |
| 2005/0006752 | A1 * | 1/2005 | Ogawa ........................ 257/700 |
| 2005/0023525 | A1 | 2/2005 | Ishikawa |
| 2007/0215962 | A1 * | 9/2007 | Minervini et al. ........... 257/414 |

FOREIGN PATENT DOCUMENTS

| EP | 1 453 088 | 9/2004 |
| JP | 2004-282050 | 10/2004 |

\* cited by examiner

*Primary Examiner*—W. David Coleman
*Assistant Examiner*—Sun M Kim
(74) *Attorney, Agent, or Firm*—Eric J. Robinson; Robinson Intellectual Property Law Office, P.C.

(57) ABSTRACT

The present invention provides a semiconductor device in which a first conductive layer included in a stack having a transistor and a second conductive layer over a substrate are electrically connected. The semiconductor device provides a conductive layer for electrically connecting the first conductive layer included in the stack having the transistor (for example, a conductive layer provided on the same layer as a gate electrode included in the transistor, a conductive layer provided on the same layer as a source wiring or a drain wiring connected to a source or drain of the transistor, a conductive layer provided in the same layer as the wire connected to the source wiring or the drain wiring, or the like) and the second conductive layer (for example, a conductive layer functioning as an antenna or a connection wire) provided over the substrate.

12 Claims, 24 Drawing Sheets

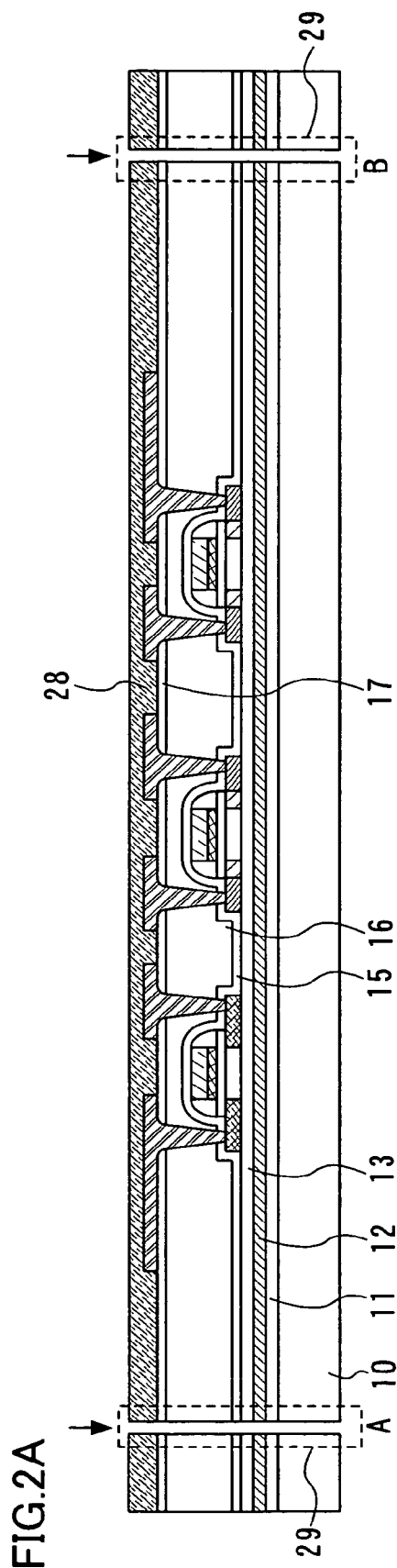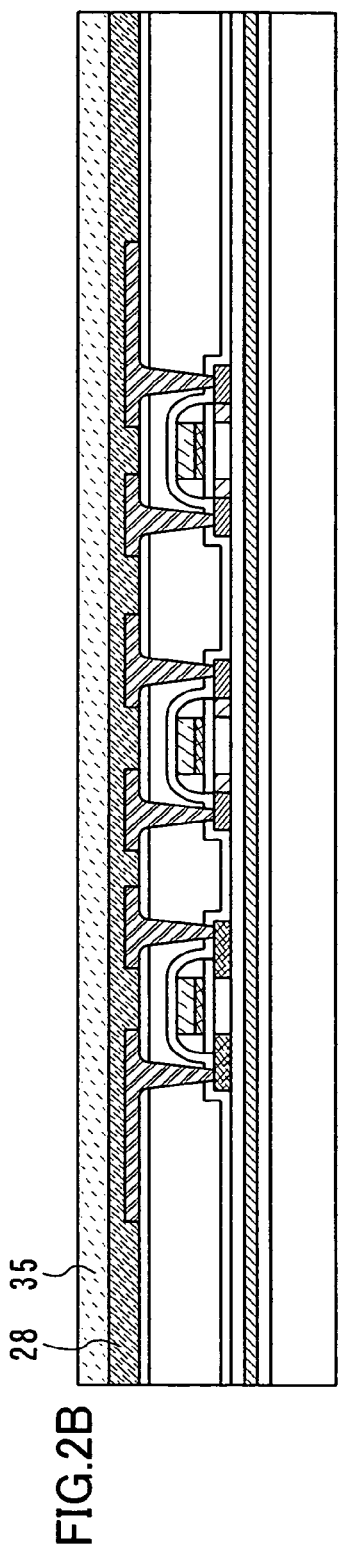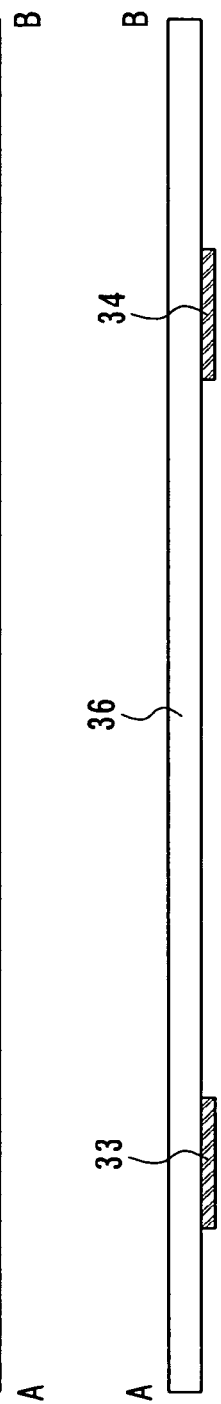

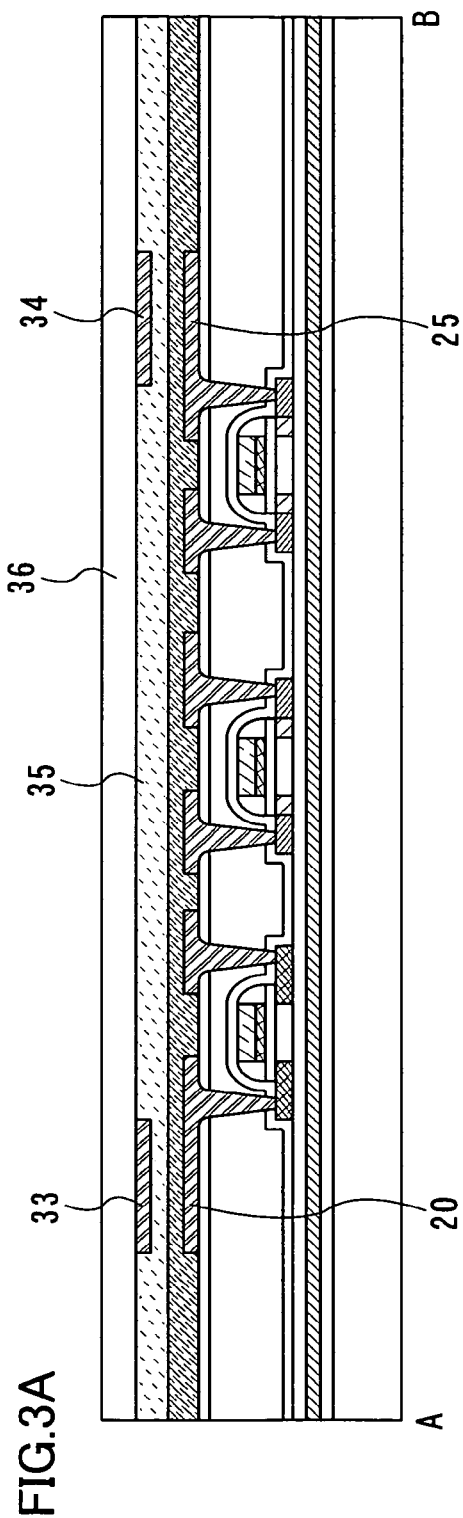
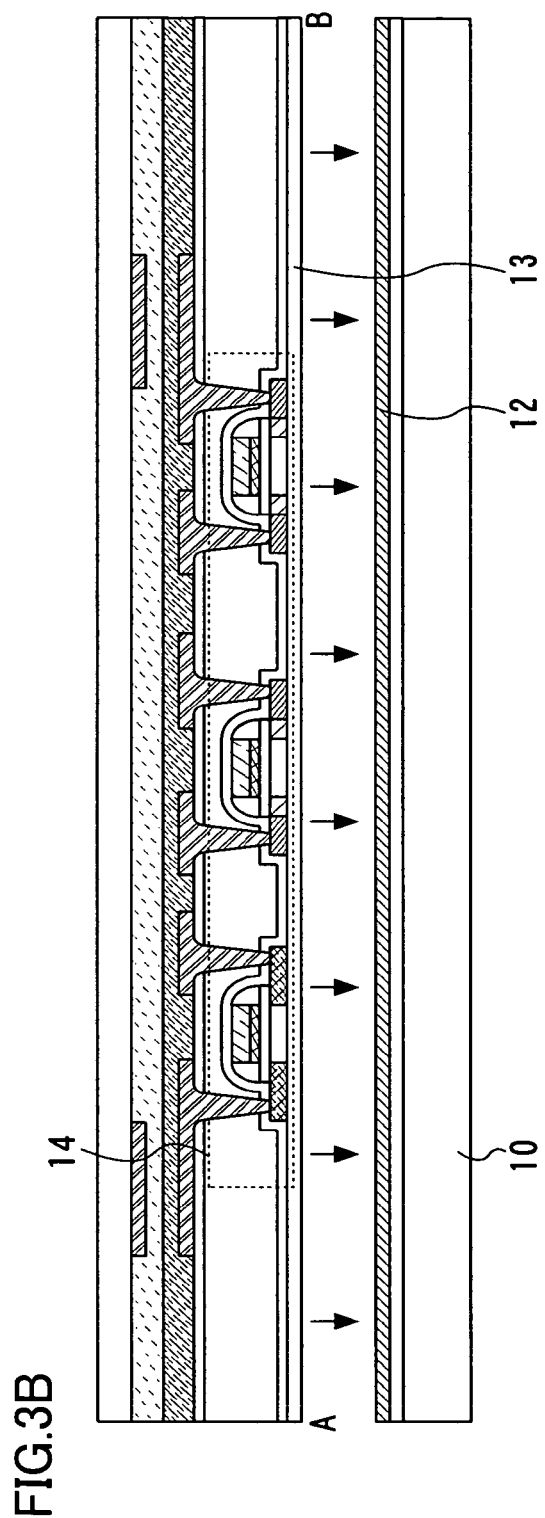
FIG.3A
FIG.3B

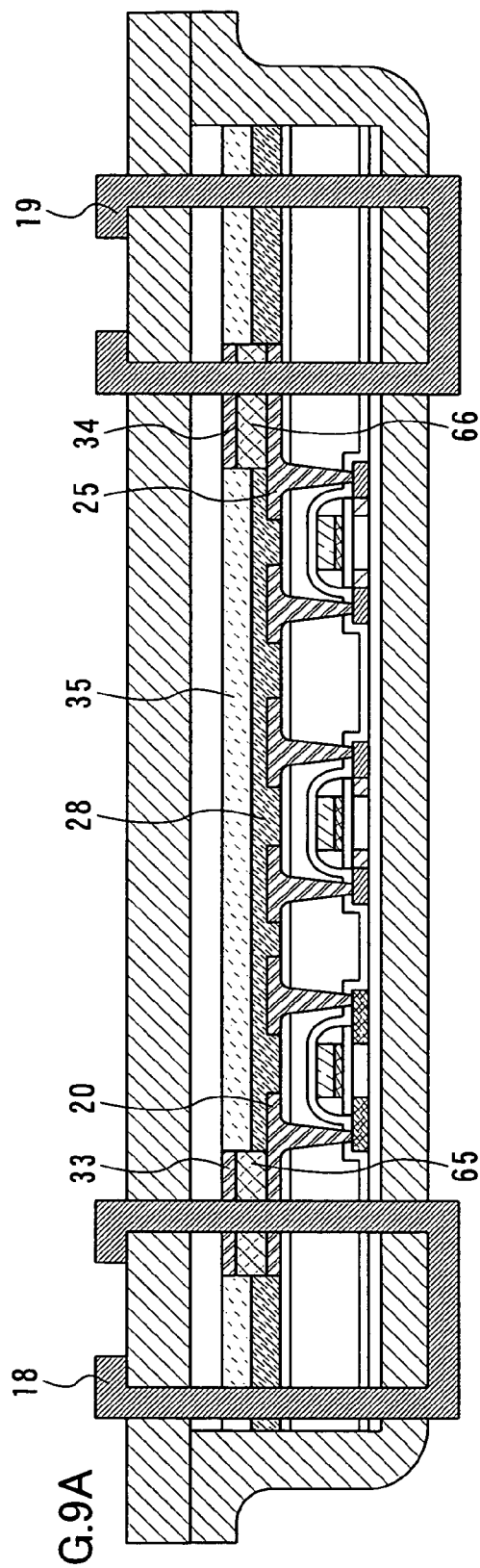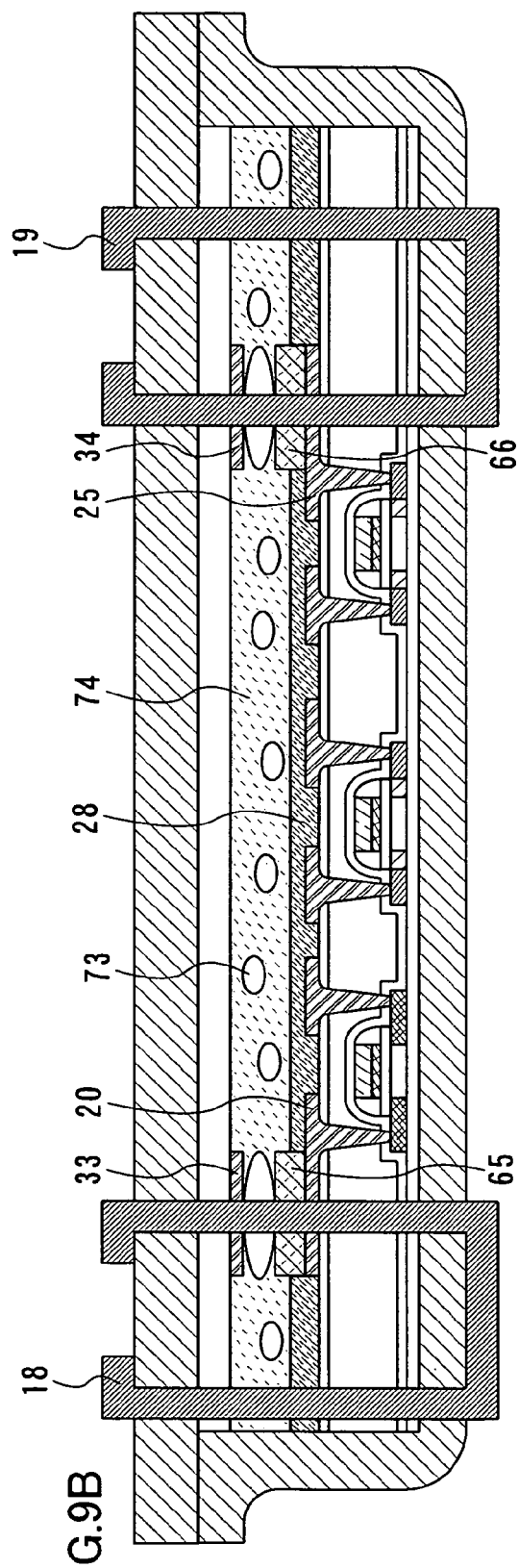

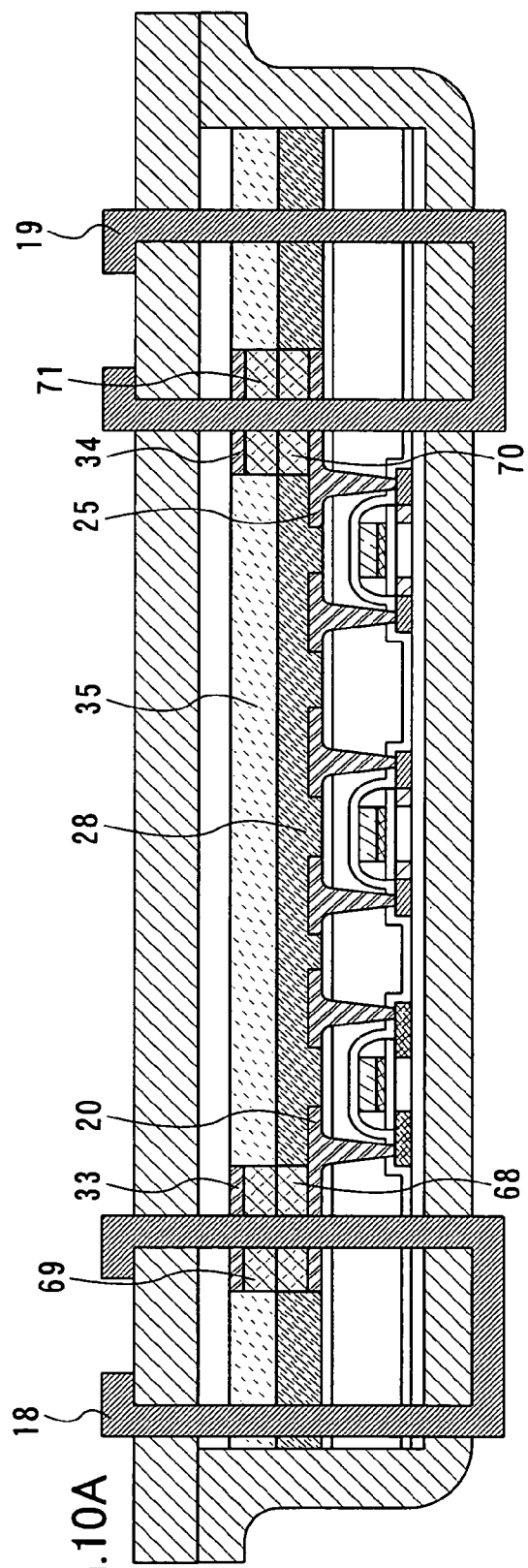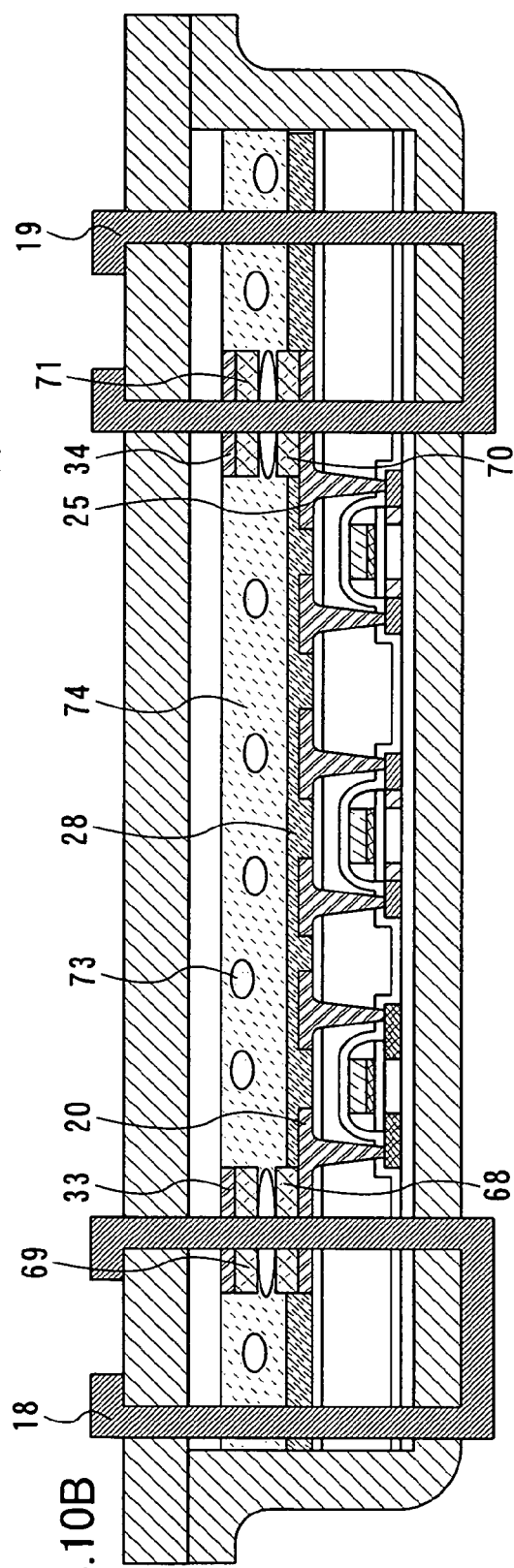
FIG.10A
FIG.10B

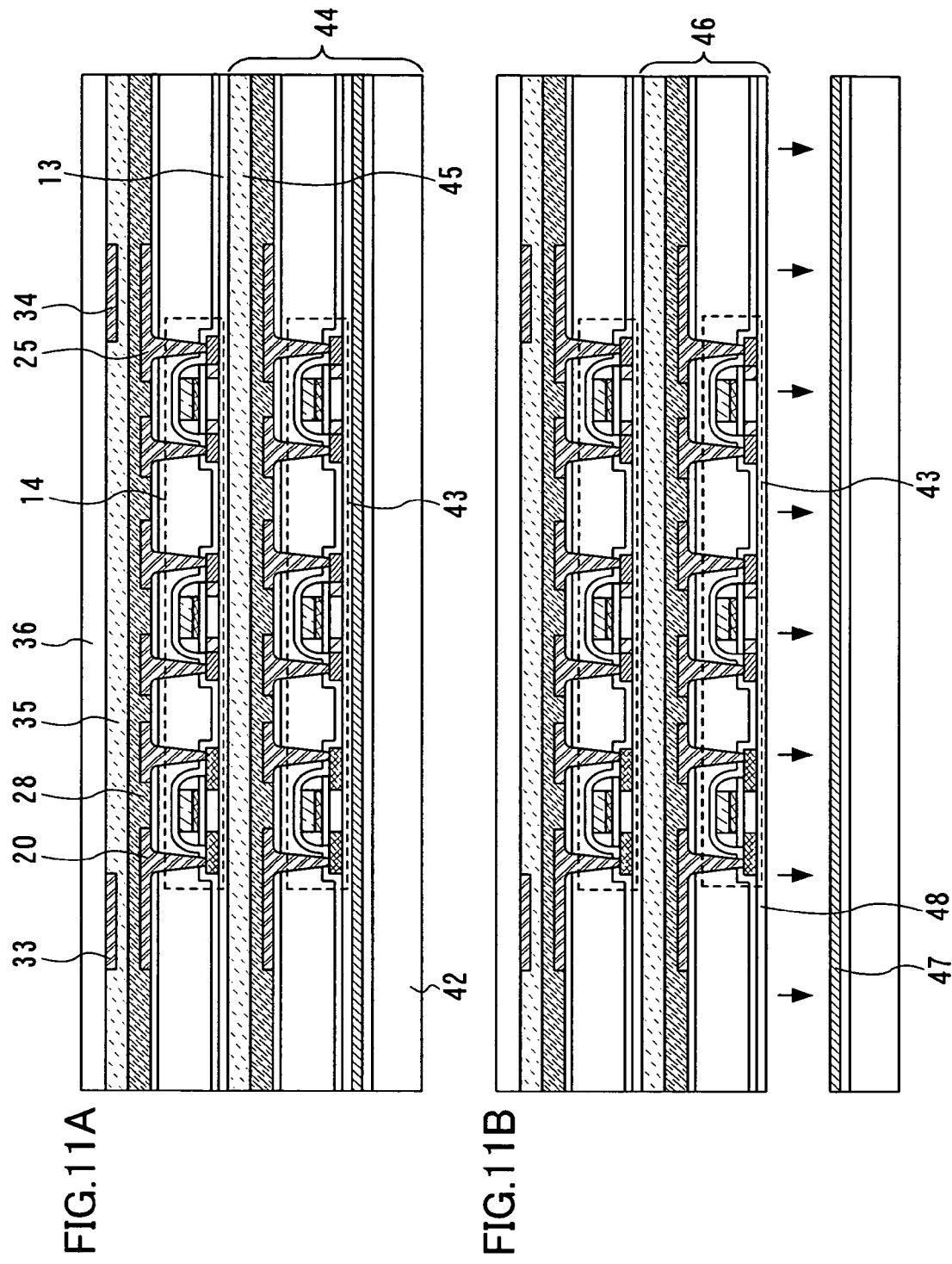

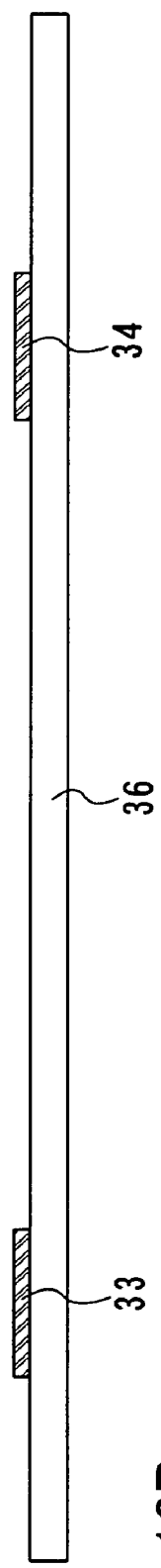
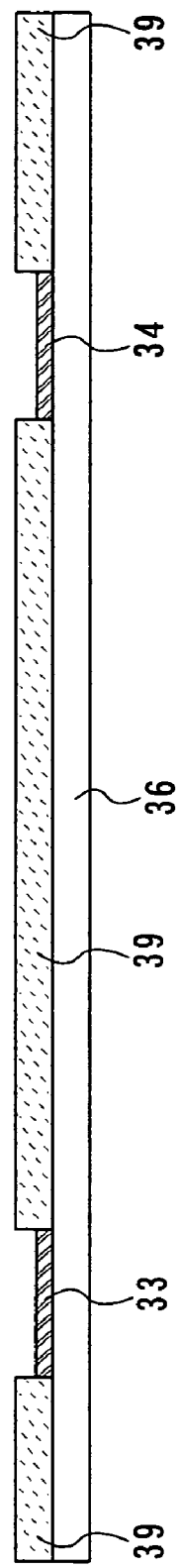
FIG.13A
FIG.13B

FIG. 18A
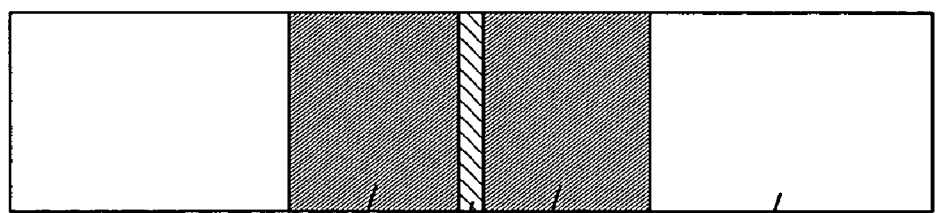
FIG. 18B
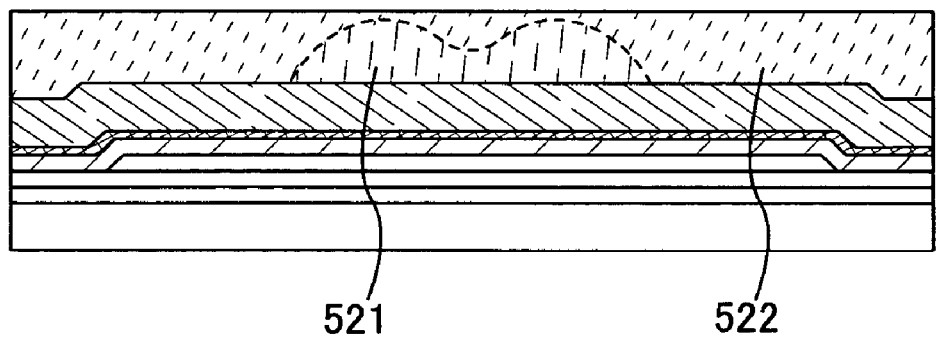

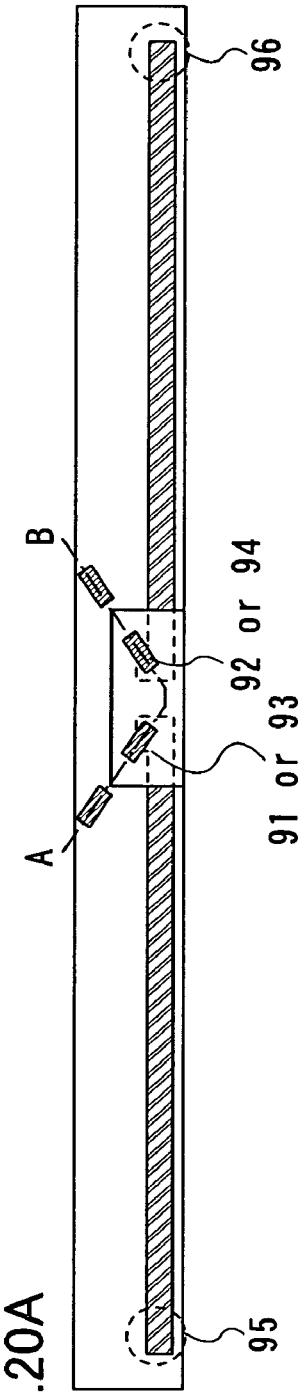
FIG.20A
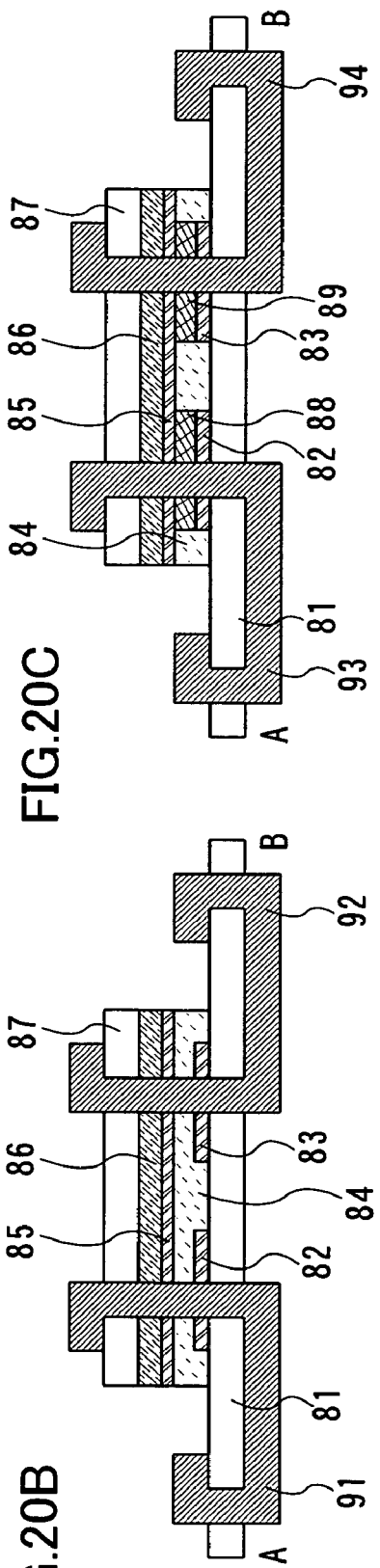
FIG.20B
FIG.20C

SEMICONDUCTOR DEVICE

BACKGROUND OF THE INVENTION

1. Field of the Invention

The present invention relates to a semiconductor device. The semiconductor device includes a transistor.

2. Description of the Related Art

In recent years, semiconductor devices capable of transmitting and receiving data wirelessly have been developed. Such semiconductor devices are called an RFID (Radio Frequency Identification), an RF chip, an RF tag, an IC chip, an IC tag, an IC label, a wireless chip, a wireless tag, an electronic chip, an electronic tag, a wireless processor, a wireless memory (for example, refer to Patent Document 1: Japanese Patent Laid-Open No. 2004-282050) and the like, and have already been introduced into some field.

The semiconductor device capable of transmitting and receiving data wirelessly uses an antenna, and is classified roughly into two categories: a semiconductor device including a substrate over which both of a transistor and an antenna are provided is used, and a semiconductor device including a first substrate provided with a transistor and a second substrate provided with an antenna are used. These two types of semiconductor devices are used properly in accordance with a frequency band in many cases. In addition, it is necessary to increase the space for an antenna in order to lengthen the communication distance of such a semiconductor device. Therefore, the first substrate provided with the transistor and the second substrate provided with the antenna are often used to increase the space for the antenna.

SUMMARY OF THE INVENTION

In the case where a stack having a transistor and a substrate provided with a conductive layer are used, it is necessary to attach the stack and the substrate to each other, and to electrically connect a first conductive layer included in the stack and a second conductive layer over the substrate to each other. Thus, the present invention provides a semiconductor device in which an electrical connection between the first conductive layer included in the stack having the transistor and the second conductive layer over the substrate can be surely performed.

A semiconductor device of the present invention is provided with a conductive layer for electrically connecting a first conductive layer included in a stack having a transistor (for example, a conductive layer provided on the same layer as a gate electrode included in the transistor, a conductive layer provided on the same layer as a source wiring or a drain wiring connected to a source or drain of the transistor, a conductive layer provided on the same layer as a wiring connected to the source wiring or the drain wiring, or the like) and a second conductive layer (for example, a conductive layer functioning as an antenna or a connection wire) provided over a substrate. Therefore, an electrical connection between the first conductive layer and the second conductive layer can be performed surely.

In addition, the conductive layer for electrically connecting the first conductive layer and the second conductive layer is provided to penetrate the first conductive layer and the second conductive layer. Therefore, the stack having the transistor and the substrate provided with the second conductive layer can be fixed to each other firmly. A detailed structure of the semiconductor device of the present invention is described below.

A semiconductor device of the present invention includes a thin film integrated circuit, a first terminal portion connected to the thin film integrated circuit, a first conductive layer provided over a substrate, a second terminal portion connected to the first conductive layer, and a second conductive layer for electrically connecting the first terminal portion and the second terminal portion and penetrating the first terminal portion, the second terminal portion and the substrate. The first terminal portion and the second terminal portion are provided to overlap with each other. In addition, the first terminal portion, the second terminal portion and the second conductive layer are provided so as not to overlap with the thin film integrated circuit.

A semiconductor device of the present invention includes a thin film integrated circuit provided over one surface of a first substrate, a first terminal portion connected to the thin film integrated circuit, a first conductive layer provided over one surface of a second substrate, a second terminal portion connected to the first conductive layer, and a second conductive layer for electrically connecting the first terminal portion and the second terminal portion and penetrating the first substrate, the first terminal portion, the second terminal portion and the second substrate. One surface of the first substrate and one surface of the second substrate are provided to be opposed to each other, and the first terminal portion and the second terminal portion are provided to overlap with each other. In addition, the first terminal portion, the second terminal portion and the second conductive layer are provided so as not to overlap with the thin film integrated circuit.

The second conductive layer for electrically connecting the first terminal portion and the second terminal portion is formed of a material which has relatively high heat or electrical conductivity (metal, for example). The second conductive layer has a shape with a thin stretched line, and can be called a linear shape conductor (conductor), a needle-shaped conductor (conductor), or a stick conductor (conductor). The second conductive layer is specifically a filament (a metal thin thread, for example, filament), a staple (for example, a U-shaped staple), a wire, or a nail. The sectional shape of the second conductive layer is a square shape, an elliptical shape, a circle shape, or the like, and the shape is not limited particularly.

In addition, the size of the second conductive layer is not limited particularly and determined appropriately by a position to be provided with the second conductive layer. In addition, the second conductive layer is provided between a plurality of terminal portions, and the plurality of terminal portions are electrically connected.

In addition, the second conductive layer is provided so as to penetrate the first terminal portion included in the stack having the transistor and the second terminal portion provided over the substrate having the conductive layer. Accordingly, the stack having the transistor and the substrate can be fixed to each other firmly.

A semiconductor device of the present invention includes a transistor including a semiconductor layer, a first insulating layer (a gate insulating layer) and a first conductive layer (a gate electrode), a second insulating layer provided over the transistor, a second conductive layer (a source wiring or a drain wiring) connected to a source or drain of the transistor through an opening provided in the second insulating layer, and a third conductive layer (corresponding to a first terminal portion) provided on the same layer as the first conductive layer or the second conductive layer.

In addition to the above-mentioned structure, the semiconductor device includes a third insulating layer provided over the second insulating layer and the second conductive layer, a fourth conductive layer provided over the third insulating layer, a fifth conductive layer (corresponding to a second terminal portion) provided on the same layer as the fourth conductive layer, a substrate provided over the third insulating layer and the fourth conductive layer, and a sixth conductive layer provided so as to electrically connect the first terminal portion and the second terminal portion, and to penetrate the first terminal portion, the second terminal portion and the substrate. The first terminal portion and the second terminal portion are provided to overlap with each other. Note that in the semiconductor device with the above-mentioned structure, an anisotropic conductive layer may be replaced with the third insulating layer.

Alternatively, in addition to the above-mentioned structure, the semiconductor device includes a third insulating layer provided over the second insulating layer and the second conductive layer, a fourth insulating layer provided over the third insulating layer, a fourth conductive layer provided over the fourth insulating layer, a fifth conductive layer (corresponding to a second terminal portion) provided on the same layer as the fourth conductive layer, a substrate provided over the fourth insulating layer and the fourth conductive layer, and a sixth conductive layer for electrically connecting the first terminal portion and the second terminal portion, and for penetrating the first terminal portion, the second terminal portion and the substrate. The first terminal portion and the second terminal portion are provided to overlap with each other. Note that in the semiconductor device with the above-mentioned structure, an anisotropic conductive layer may be replaced with the fourth insulating layer.

Alternatively, in addition to the above-mentioned structure, the semiconductor device includes a third insulating layer selectively provided over the second insulating layer and the second conductive layer, a bump in contact with the third conductive layer through an opening provided in the third insulating layer, a fourth conductive layer provided over the third insulating layer, a fifth conductive layer (corresponding to a second terminal portion) provided on the same layer as the fourth conductive layer and in contact with the bump, a substrate provided over the third insulating layer and the fourth conductive layer, and a sixth conductive layer for electrically connecting the first terminal portion and the second terminal portion, and for penetrating the first terminal portion, the second terminal portion and the substrate. The first terminal portion and the second terminal portion are provided to overlap with each other.

Alternatively, in addition to the above-mentioned structure, the semiconductor device includes a third insulating layer selectively provided over the second insulating layer and the second conductive layer, a bump in contact with the third conductive layer through an opening provided in the third insulating layer, an anisotropic conductive layer provided over the third insulating layer and the bump, a fourth conductive layer provided over the anisotropic conductive layer, a fifth conductive layer (corresponding to a second terminal portion) provided on the same layer as the fourth conductive layer and in contact with the bump, a substrate provided over the anisotropic conductive layer and the fourth conductive layer, and a sixth conductive layer for electrically connecting a first terminal portion and the second terminal portion, and for penetrating the first terminal portion, the second terminal portion and the substrate. The first terminal portion and the second terminal portion are provided to overlap with each other.

Alternatively, in addition to the above-mentioned structure, the semiconductor device includes a third insulating layer selectively provided over the second insulating layer and the second conductive layer, a first bump in contact with the third conductive layer through an opening provided in the third insulating layer, a fourth insulating layer selectively provided over the third insulating layer, a second bump in contact with the first bump through an opening provided in the fourth insulating layer, a fourth conductive layer provided over the fourth insulating layer, a fifth conductive layer (corresponding to a second terminal portion) provided on the same layer as the fourth conductive layer and in contact with the second bump, a substrate provided over the fourth insulating layer and the fourth conductive layer, and a sixth conductive layer for electrically connecting the first terminal portion and the second terminal portion, and to penetrating the first terminal portion, the second terminal portion and the substrate. The first terminal portion and the second terminal portion are provided to overlap with each other.

Alternatively, in addition to the above-mentioned structure, the semiconductor device includes a third insulating layer selectively provided over the second insulating layer and the second conductive layer, a first bump in contact with the third conductive layer through an opening provided in the third insulating layer, an anisotropic conductive layer provided over the third insulating layer and the first bump, a second bump provided over the anisotropic conductive layer, a fourth conductive layer provided over the anisotropic conductive layer, a fifth conductive layer (corresponding to a second terminal portion) provided on the same layer as the fourth conductive layer, a substrate provided over the anisotropic conductive layer and the fourth conductive layer, and a sixth conductive layer for electrically connecting the first terminal portion and the second terminal portion, and for penetrating the first terminal portion, the second terminal portion and the substrate. The first terminal portion and the second terminal portion are provided to overlap with each other.

In the semiconductor device with the above-mentioned structure, the fourth and fifth conductive layers function as an antenna. In addition, a material including gold, silver or copper is used for the bump (also called a projection electrode). A material including silver with low resistance is preferably used.

The sixth conductive layer for connecting the first terminal portion and the second terminal portion is formed of a material which has relatively high heat or electrical conductivity. The sixth conductive layer has a shape with a thin stretched line.

In addition, by providing a conductive layer penetrating the first terminal portion and the second terminal portion, static electricity charged in a semiconductor device is discharged and deterioration or breakdown of the semiconductor element included in the semiconductor device can be prevented. In other words, by providing the conductive layer penetrating the first terminal portion and the second terminal portion, an electrostatic breakdown of a semiconductor device can be prevented.

By the present invention, an electrical connection between the first conductive layer included in a stack having a transistor and the second conductive layer provided over the substrate can be performed surely. In addition, the stack having the transistor and the substrate provided with the second conductive layer can be fixed to each other firmly. In addition, a resistance value between the first conductive layer and the second conductive layer is lowered, and power consumption can be reduced.

BRIEF DESCRIPTION OF THE DRAWINGS

FIGS. 2A to 2C are diagrams illustrating a semiconductor device of the present invention.

FIGS. 3A and 3B are diagrams illustrating a semiconductor device of the present invention.

FIGS. 9A and 9B are diagrams illustrating a semiconductor device of the present invention.

FIGS. 10A and 10B are diagrams illustrating a semiconductor device of the present invention.

FIGS. 11A and 11B are diagrams illustrating a semiconductor device of the present invention.

FIGS. 13A and 13B are diagrams illustrating a substrate provided with a conductive layer functioning as an antenna.

FIGS. 18A and 18B are diagrams illustrating a transistor and a manufacturing method thereof.

FIGS. 20A to 20C are diagrams illustrating an experimental result.

DETAILED DESCRIPTION OF THE INVENTION

Figure 1A:
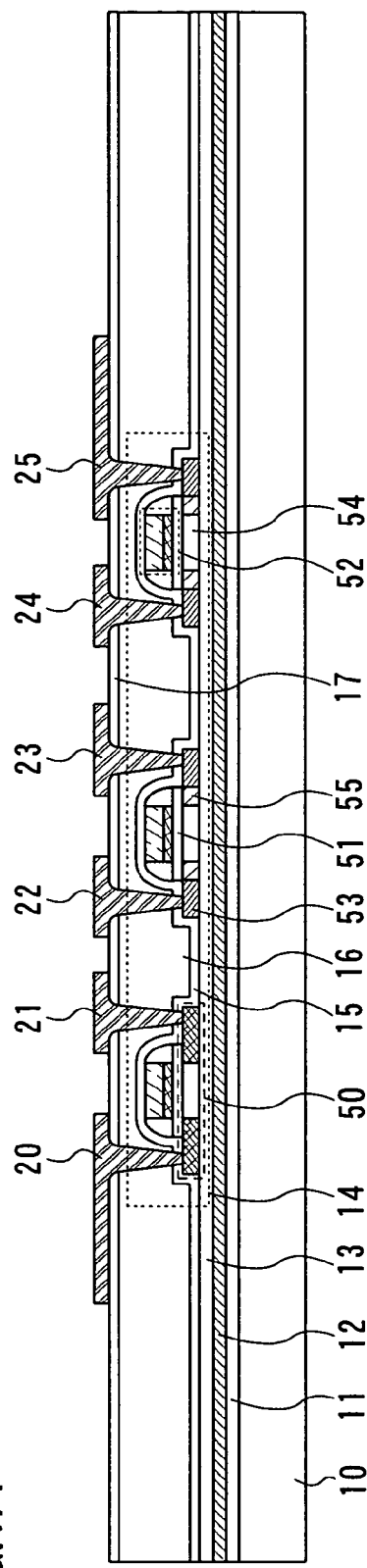
FIGS. 1A and 1B are diagrams illustrating a semiconductor device of the present invention.

Although the present invention will be fully described by way of embodiment modes with reference to the accompanying drawings, it is to be understood that various changes and modifications will be apparent to those skilled in the art. Therefore, unless such changes and modifications depart from the scope of the present invention, they should be construed as being included therein. Note that the same reference numeral is used among different drawings to denote the same component in the structure of the present invention described below.

Embodiment Mode 1

A structure of a semiconductor device of the present invention will be described with reference to FIGS. 23A to 24B. FIG. 23C is a cross-sectional view along a line from point A to point B of a top view of FIG. 23A, FIG. 23D is a cross-sectional view along a line from point A to point B of a top view of FIG. 23B, and FIG. 24B is a cross-sectional view along a line from point A to point B of FIG. 24A.

Figure 23A:
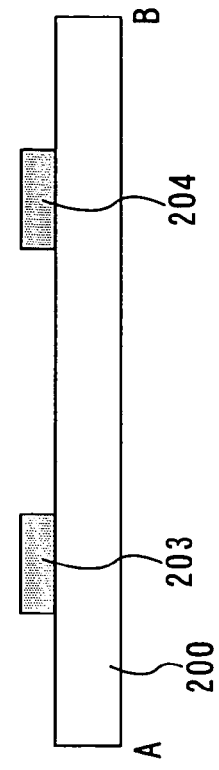
FIGS. 23A to 23D are diagrams illustrating a semiconductor device of the present invention.
Figure 23C:
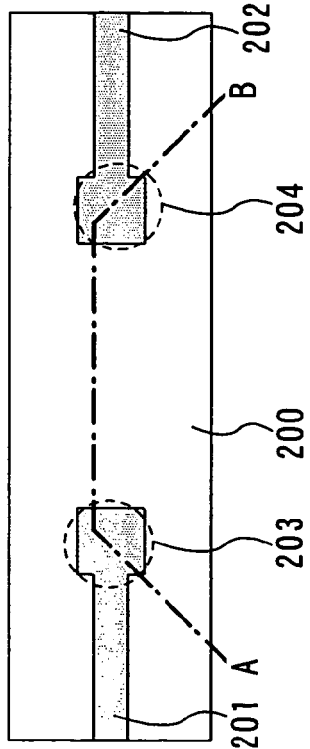
Figure 24B:
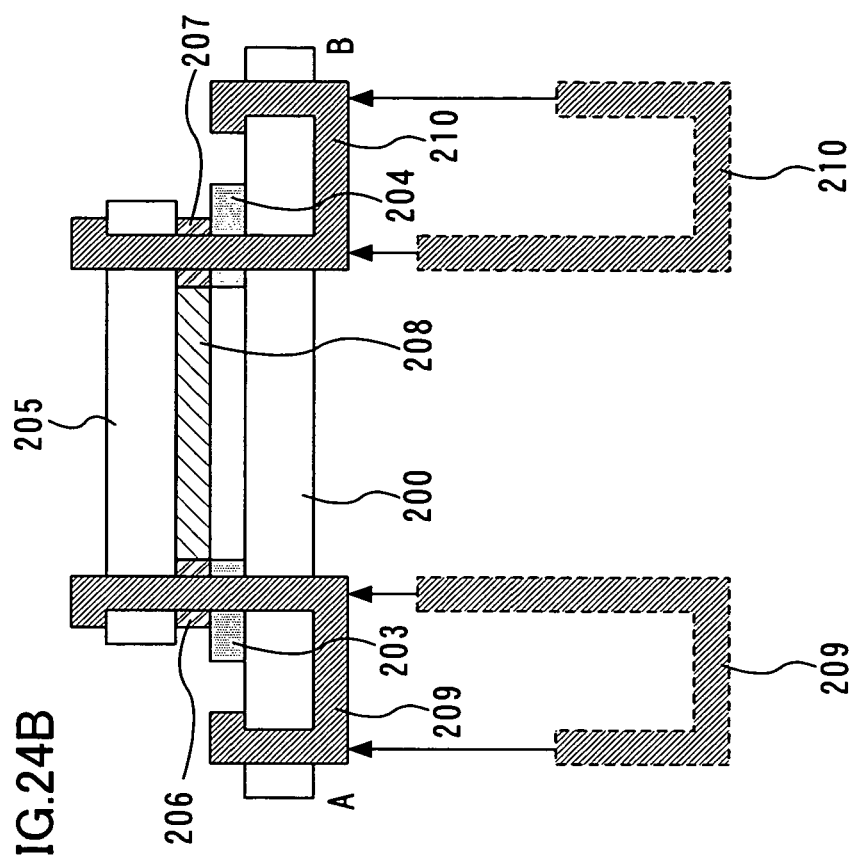
FIGS. 24A and 24B are diagrams illustrating a semiconductor device of the present invention.

Conductive layers 201 and 202 are provided over one surface of a substrate 200 (see FIGS. 23A and 23C). The conductive layers 201 and 202 are used as an antenna or a connection wire. A terminal portion 203 is an edge portion of the conductive layer 201, and a terminal portion 204 is an edge portion of the conductive layer 202.

Figure 23B:
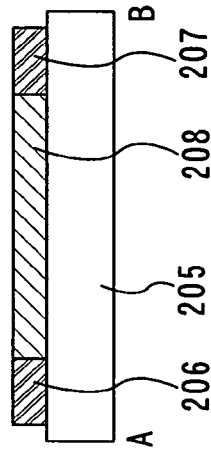
Figure 23D:
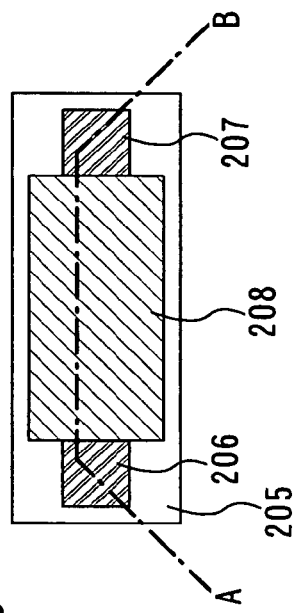

A thin film integrated circuit 208 is provided over one surface of a substrate 205 (see FIGS. 23B and 23D). In addition, terminal portions 206 and 207 connected to the thin film integrated circuit 208 are provided over one surface of the substrate 205. The thin film integrated circuit 208 has a plurality of transistors. The terminal portions 206 and 207 are formed of a conductive layer of the same layer as a gate electrode of the transistor included in the thin film integrated circuit 208, a conductive layer of the same layer as a source wiring and a drain wiring, a conductive layer of the same layer as a wiring connected to the source wiring and the drain wiring, or the like.

The terminal portions 206 and 207 are electrically connected to transistors among the plurality of transistors included in the thin film integrated circuit 208.

Figure 24A:
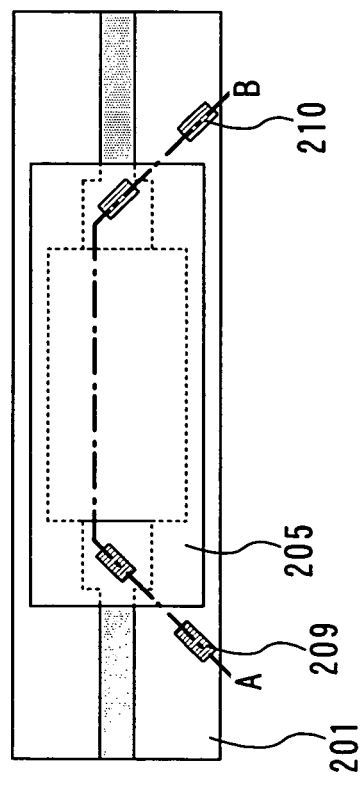

The substrate 200 and the substrate 205 are provided so that one surface of the substrate 200 and one surface of the substrate 205 are opposed to each other (see FIGS. 24A and 24B). At this time, the terminal portion 203 and the terminal portion 206 are disposed to overlap with each other. In addition, the terminal portion 204 and the terminal portion 207 are also disposed to overlap with each other. Then, a conductive layer 209 penetrating the substrate 200, the terminal portion 203, the terminal portion 206, and the substrate 205 is provided. In addition, a conductive layer 210 penetrating the substrate 200, the terminal portion 204, the terminal portion 207, and the substrate 205 is provided. At this time, the conductive layers 209 and 210 are provided so as not to overlap with the thin film integrated circuit 208.

By providing the conductive layers 209 and 210, the terminal portion 203 and the terminal portion 204 can be electrically connected to the terminal portion 206 and the terminal portion 207, respectively. In addition, by providing the conductive layers 209 and 210, the substrate 200 and the substrate 205 can be attached to each other firmly.

Note that the substrate 205 may be separated from a stack including the thin film integrated circuit 208. Accordingly, downsizing, thinning, and weight saving can be realized. In addition, in the above-mentioned structure, the thin film integrated circuit 208 is provided over only one surface of the substrate 205; however, the present invention is not limited to this mode. A thin film integrated circuit may be provided over one surface of the substrate 200.

Embodiment Mode 2

In order to describe a structure of a semiconductor device of the present invention, a manufacturing method of the semiconductor device will be described with reference to cross-sectional views of FIG. 1A to FIG. 4 and top views of FIG. 5A to FIG. 6D. Note that FIG. 1B corresponds to a cross-sectional view along a line from point A to point B of a top view of FIG. 5A, FIG. 2A corresponds to a cross-sectional view along a line from point A to point B of top views of FIGS. 5B and 5C, and FIG. 2B corresponds to a cross-sectional view along a line from point A to point B of a top view of FIG. 5D. In addition, FIG. 2C corresponds to a cross-sectional view along a line from point A to point B of a top view of FIG. 6A, FIG. 3B corresponds to a cross-sectional view along a line from point A to point B of a top view of FIG. 6B, and FIG. 4 corresponds to a cross-sectional view along a line from point A to point B of top views of FIGS. 6C and 6D.

First, an insulating layer 11 is formed over a surface of a substrate 10 (see FIG. 1A). Next, a separation layer 12 is formed over the insulating layer 11. Then, an insulating layer 13 is formed over the separation layer 12.

The substrate 10 is a glass substrate, a plastic substrate, a silicon substrate, a quartz substrate, or the like. As the substrate 10, a glass substrate or a plastic substrate is preferably used. This is because a glass substrate or a plastic substrate having a side of 1 meter or more or having a predetermined shape such as a square can be easily manufactured. Thus, when a glass substrate or a plastic substrate which has a square shape and has a side of 1 meter or more is used for example, productivity can be drastically improved. This is a great advantage compared with the case of using a silicon substrate having a circular shape with a diameter of about 30 centimeters at most.

An oxide or nitride of silicon, an oxide of silicon containing nitrogen, a nitride of silicon containing oxygen, or the like are formed by a plasma CVD method or a sputtering method as the insulating layers 11 and 13. The insulating layer 11 prevents an impurity element from entering an upper layer from the substrate 10. The insulating layer 11 is not formed unless required.

The separation layer 12 is formed by a plasma CVD method or a sputtering method as a single layer or a stacked layer including an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si), or an alloy material or a compound material containing the above described element as its main component. The crystal structure of the layer containing silicon may be any of the amorphous, microcrystalline, or polycrystalline structure.

In the case where the separation layer 12 has a single-layer structure, a tungsten layer, a molybdenum layer, or a layer containing a mixture of tungsten and molybdenum is formed preferably. Alternatively, a layer containing oxide, oxynitride, or nitride oxide of tungsten, a layer containing oxide, oxynitride, or nitride oxide of molybdenum, or a layer containing oxide, oxynitride, or nitride oxide of a mixture of tungsten and molybdenum may be formed.

In the case where the separation layer 12 has a stack structure, it is preferable to form a tungsten layer, a molybdenum layer, or a layer containing a mixture of tungsten and molybdenum as a first layer, and to form a layer containing oxide, or oxynitride of tungsten, a layer containing oxide or oxynitride of molybdenum, or a layer containing oxide or oxynitride of a mixture of tungsten and molybdenum as a second layer.

When the separation layer 12 is formed to have a stack of a layer containing tungsten and a layer containing oxide of tungsten, first, the layer containing tungsten may be formed as the separation layer 12 and a layer containing oxide of silicon may be formed as the insulating layer 13 thereover so that a layer containing oxide of tungsten is formed at the interface between the layer containing tungsten and the layer containing oxide of silicon. This also applies to the case of forming a layer containing nitride, oxynitride, or nitride oxide of tungsten or the like. In such a case, after a layer containing tungsten is formed, a layer containing nitride of silicon, a silicon nitride layer containing oxygen, or a silicon oxide layer containing nitrogen may be formed thereover.

Subsequently, a plurality of transistors 14 are formed over the insulating layer 13. In this embodiment mode, thin film transistors are formed as the plurality of transistors 14. Each of the plurality of transistors 14 includes a semiconductor layer 50, a gate insulating layer (also merely called an insulating layer) 51, and a conductive layer 52 serving as a gate (also called a gate electrode). The semiconductor layer 50 includes impurity regions 53 and 55 serving as a source or drain, and a channel forming region 54. The impurity regions 53 and 55 are doped with an impurity element which imparts n-type or p-type conductivity. Specifically, the impurity regions 53 and 55 are doped with an impurity element imparting n-type conductivity (such as phosphorus (P) or arsenic (As)) or an impurity element imparting p-type conductivity (for example, boron (B)). The impurity regions 55 are LDD (Lightly Doped Drain) regions. Each of the plurality of transistors 14 may have either of a top-gate structure in which the gate insulating layer 51 is formed over the semiconductor layer 50 and the conductive layer 52 is formed over the gate insulating layer 51, or a bottom-gate structure in which the gate insulating layer 51 is formed over the conductive layer 52 and the semiconductor layer 50 is formed over the gate insulating layer 51.

Note that in the structure shown in the drawing, only the plurality of transistors 14 are formed; however, the present invention is not limited thereto. An element to be provided over the substrate 10 may be appropriately changed in accordance with the usage of the semiconductor device. For example, in the case of forming a semiconductor device having a function of transmitting and receiving data wirelessly, only a plurality of transistors, or a plurality of transistors and a conductive layer serving as an antenna may be formed over the substrate 10. In addition, in the case of forming a semiconductor device having a function of storing data, a plurality of transistors and a memory element (for example, a transistor, a memory transistor, or the like) are preferably formed over the substrate 10. Further, in the case of forming a semiconductor device having a function of controlling a circuit or generating a signal or the like (for example, a CPU, a signal generation circuit, or the like), transistors are preferably formed over the substrate 10. In addition to the above-mentioned elements, another element such as a resistor or a capacitor may be formed if necessary.

Insulating layers 15 to 17 are formed over the plurality of transistors 14. The insulating layers 15 to 17 are formed of an oxide of silicon, a nitride of silicon, polyimide, acrylic, siloxane, or the like by a plasma CVD method, a sputtering method, an SOG (Spin On Glass) method, a droplet discharge method, or the like. Siloxane is composed of, for example, a skeleton formed by the bond of silicon and oxygen, in which an organic group containing at least hydrogen (such as an alkyl group or aromatic hydrocarbon), a fluoro group, or a fluoro group and an organic group containing at least hydrogen may be used as the substituent. In the above-described structure, three-layered insulating layers (the insulating layers 15 to 17) are formed over the plurality of transistors 14; however, the present invention is not limited thereto. The number of insulating layers provided over the plurality of transistors 14 is not particularly limited.

Subsequently, openings are formed in the insulating layers 15 to 17 and conductive layers 20 to 25 are formed, which are each connected to a source (also called a source region) or a drain (also called a drain region) of the plurality of transistors 14. The conductive layers 20 to 25 are formed by a plasma CVD method, a sputtering method, or the like as a single layer or a stacked layer including an element selected from titanium (Ti), aluminum (Al), or the like, or an alloy material or a compound material containing the above-described elements as its main component. The conductive layers 20 to 25 serve as a source wiring or a drain wiring. In addition, the conductive layers 20 and 25 serve as a terminal portion.

Figure 1B:
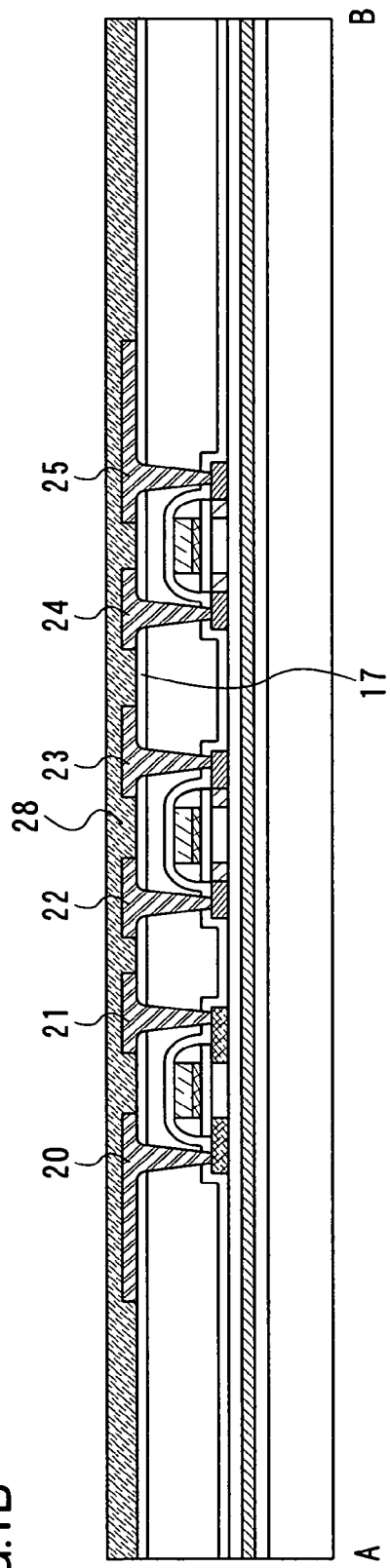
Figure 5C:
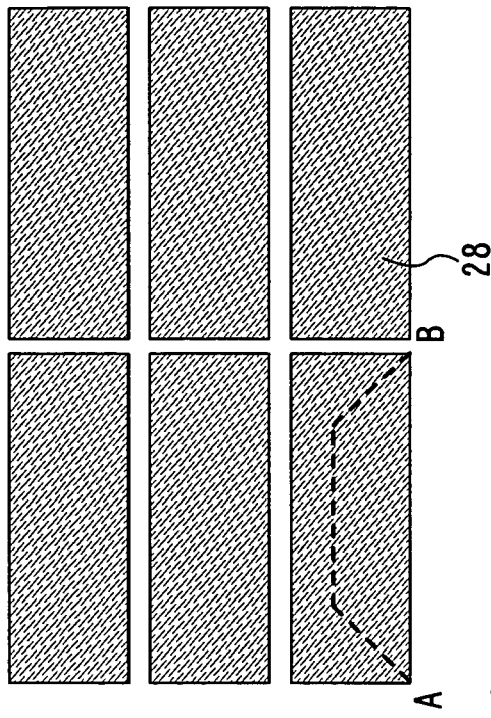
FIGS. 5A to 5D are diagrams illustrating a semiconductor device of the present invention.
Figure 5D:
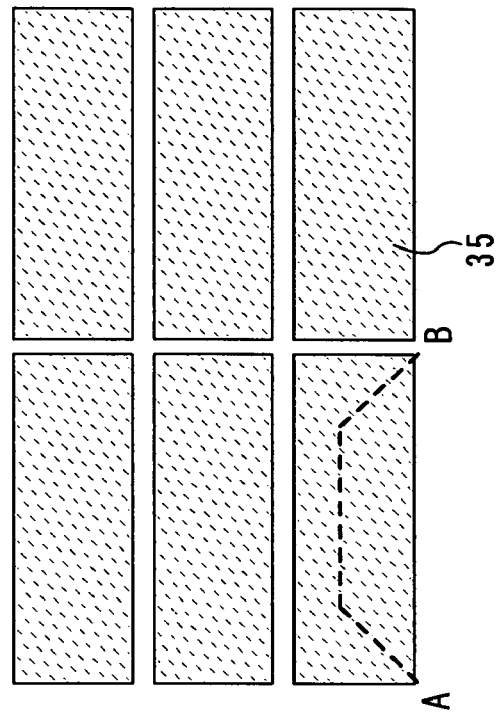
Figure 5A:
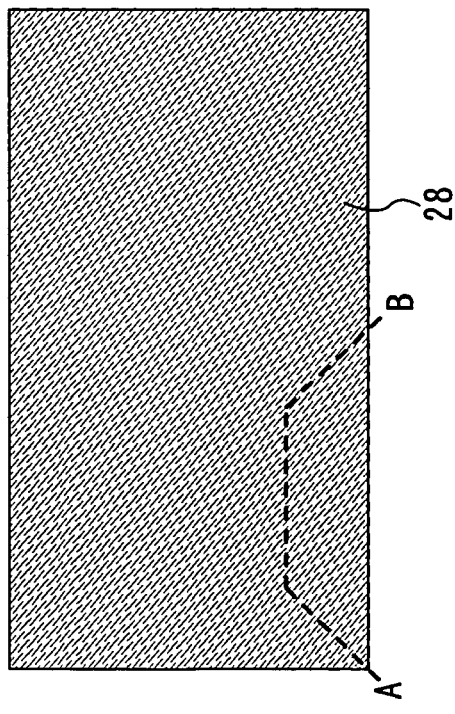

Next, an insulating layer 28 is formed over the insulating layer 17 and the conductive layers 20 to 25 (see FIG. 1B and FIG. 5A). The insulating layer 28 is formed of an insulating resin to have a thickness of 5 to 200 μm, and preferably 15 to 35 μm. The insulating resin means, for example, an epoxy resin, an acrylic resin, a polyimide resin, or the like. The insulating layer 28 is uniformly formed by a screen printing method, a droplet discharge method (for example, an inkjet method), a photolithography method, or the like. Among these methods, a screen printing method is preferably used. This is because the treatment time is short and the apparatus is cheap in the case of using the screen printing method.

Figure 5B:
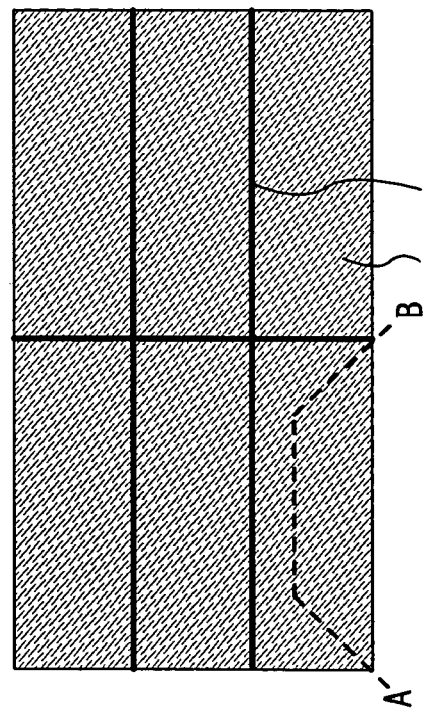

Then, openings 29 are formed so as to expose at least a part of the separation layer 12 (see FIG. 2A, FIGS. 5B and 5C). This step is performed by a photolithography method, laser beam irradiation, or the like, and the laser beam irradiation is preferably used because the treatment time is short. The substrate 10, the insulating layer 11, the separation layer 12, the insulating layers 13, 15 to 17, and 28 are irradiated with a laser beam. The laser beam irradiation is performed from the surface side of the insulating layer 28. The openings 29 are formed to expose at least a part of the separation layer 12. Accordingly, the openings 29 are formed at least in the insulating layers 13, 15 to 17 and 28. A case where a laser beam reaches the substrate 10 is shown in FIGS. 2A and 5B. In addition, a case where the substrate 10 is divided into six portions is described in FIG. 5C.

A laser includes a laser medium, an excitation source, and a resonator. A laser can be classified by its medium into a gas laser, a liquid laser, or a solid-state laser. In addition, the laser can be classified by its oscillation characteristics into a free electron laser, a semiconductor laser, or an X-ray laser. In the present invention, any of such lasers may be used. Note that a gas laser or a solid-state laser is preferably used, and more preferably, a solid-state laser is used.

As examples of the gas laser, there are a helium-neon laser, a carbon dioxide gas laser, an excimer laser, and an argon ion laser. As the excimer laser, a rare gas excimer laser or a rare gas halide excimer laser can be used. Any of three types of excited molecules, which are argon, krypton, and xenon can be used for the rare gas excimer laser. As the argon ion laser, a rare gas ion laser or a metal vapor ion laser can be given.

As the liquid laser, there are an inorganic liquid laser, an organic chelate laser, and a dye laser. In the inorganic liquid laser and the organic chelate laser, a rare-earth ion of neodymium or the like which is utilized for a solid-state laser is used as a laser medium.

A laser medium used in a solid-state laser is formed by doping a solid-state parent substance with an active species functioning as a laser. The solid-state parent substance is crystal or glass. The crystal refers to YAG (yttrium aluminum garnet crystal), YLF, $YVO_4$, $YAlO_3$, sapphire, ruby, or alexandrite. In addition, the active species functioning as a laser is, for example, a trivalent ion ($Cr^{3+}$, $Nd^{3+}$, $Yb^{3+}$, $Tm^{3+}$, $Ho^{3+}$, $Er^{3+}$, or $Ti^{3+}$).

Note that a continuous wave laser beam or a pulsed laser beam can be used as the laser used in the present invention. In addition, an irradiation condition of a laser beam such as frequency, power density, energy density, or beam profile is appropriately adjusted in consideration of the thickness of a stack including the plurality of transistors 14 or the like.

A step of irradiation with the above-described laser beam uses ablation processing. The ablation processing is a process using a phenomenon, which is generated in a portion irradiated with a laser beam, that is, a phenomenon that a molecular bond of a portion which is irradiated with a laser beam and thus absorbs the laser beam, is broken, photodegraded, and evaporated. In other words, in the present invention, the openings 29 are formed by irradiating a portion of the substrate 10, the insulating layer 11, the separation layer 12, the insulating layers 13, 15 to 17, and 28 with a laser beam so as to break a molecular bond, to photodegrade, and to evaporate the portion.

Solid-state laser having a wavelength of 1 to 380 nm, which is an ultraviolet region, may be used as laser. Preferably, Nd: $YVO_4$ laser having a wavelength of 1 to 380 nm is used because it is more easily absorbed in a substrate compared with other laser having a longer wavelength, and ablation processing is possible. Further, the periphery of the processing portion is not affected by the Nd: $YVO_4$ laser, which means good processability can be provided.

Next, an insulating layer 35 is formed over the insulating layer 28 (see FIG. 2B and FIG. 5D). The insulating layer 35 is formed by using an insulating material. In addition, the insulating layer 35 is formed by using an adhesive agent such as a thermosetting resin, an ultraviolet curable resin, a polyvinyl acetate resin-based adhesive, a vinyl copolymer resin-based adhesive, an epoxy resin-based adhesive, a urethane resin-based adhesive, a rubber-based adhesive, or an acrylic resin-based adhesive. In addition, the insulating layer 35 is formed by using an anisotropic conductive material in which a conductive filler is provided in an adhesive agent. The material in which the conductive filler is provided in the adhesive agent is called ACP (Anisotropic Conductive Paste). The insulating layer 35 is formed uniformly by a screen printing method, a droplet discharge method, a photolithography method, or the like.

Figure 6A:
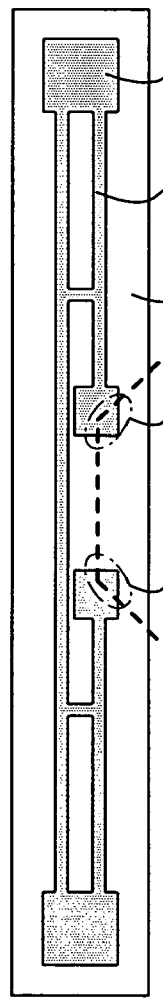
FIGS. 6A to 6D are diagrams illustrating a semiconductor device of the present invention.

Next, a substrate 36 provided with an antenna (a conductive layer serving as an antenna) 40 and a capacitor 41 is prepared (see FIG. 2C and FIG. 6A). Each of the antenna 40 and the capacitor 41 is formed by a screen printing method, a droplet discharge method, a photolithography method, a sputtering method, a CVD method, or the like. In FIG. 2C, conductive layers 33 and 34 which are a part of the antenna 40 are illustrated. The conductive layers 33 and 34 are the part of the antenna and terminal portions.

Next, the substrate 36 provided with the conductive layers 33 and 34 is formed over the insulating layer 35 (see FIG. 3A). At this time, the substrate 36 is formed so that the conductive layer 33 and the conductive layer 34 overlap with a part of the conductive layer 20 and a part of the conductive layer 25, respectively. The part of the conductive layer 20 and the part of the conductive layer 25 are terminal portions.

Subsequently, the insulating layer 35 and the substrate 36 are attached to each other, if required. At this time, they are attached to each other by either or both of pressure treatment and heat treatment with a flip chip bonder, a die bonder, an ACF bonder, a crimping machine, or the like.

Figure 6B:
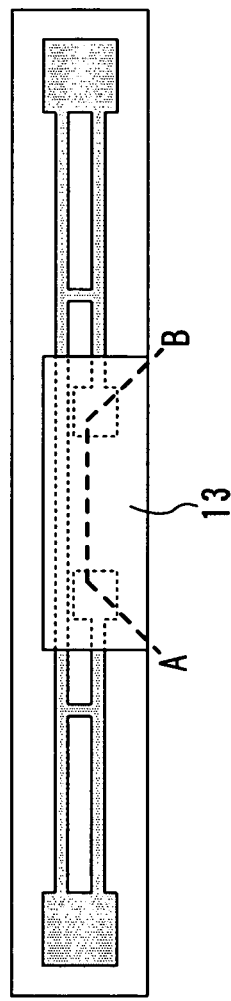

Next, the stack including the plurality of transistors 14 is separated from the substrate 10 by using the substrate 36 (see FIG. 3B and FIG. 6B). When separation occurs inside the separation layer 12 or at a boundary between the separation layer 12 and the insulating layer 13, the stack including the plurality of transistors 14 is separated from the substrate 10. The drawing shows a case where the separation occurs at the boundary between the separation layer 12 and the insulating layer 13. Note that a step of separating the stack from the substrate 10 is performed by using the substrate 36. By the above-mentioned characteristics, separation can be performed easily and in a short time.

Figure 6C:
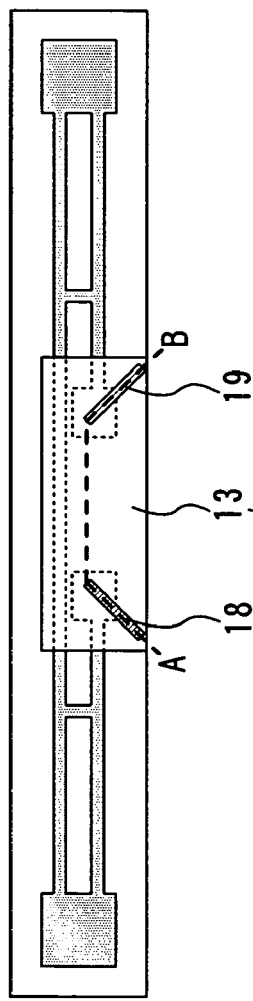
Figure 6D:
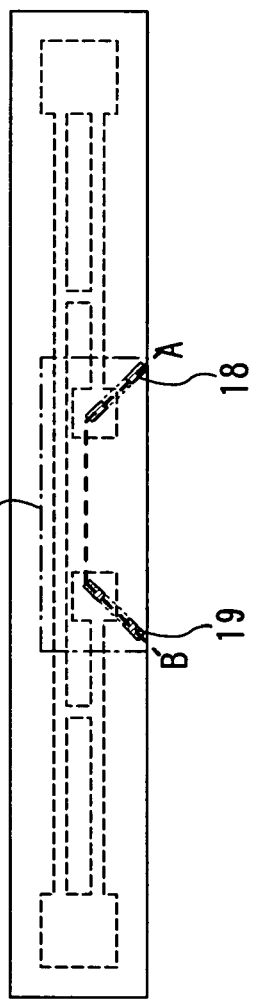

Subsequently, a conductive layer 18 is provided so as to penetrate the insulating layers 13, 15, 16, 17, the conductive layer 20, the insulating layers 28 and 35, the conductive layer 33, and the substrate 36 (see FIGS. 4, 6C, and 6D). Further, a conductive layer 19 is provided so as to penetrate the insulating layers 13, 15, 16, 17, the conductive layer 25, the insulating layers 28 and 35, the conductive layer 34, and the substrate 36. The conductive layers 18 and 19 are formed by using a stainless steel wire which is wiredrawn, an annealed steel wire which is galvanized and wiredrawn at room temperature, or the like. As a means to provide the conductive layers 18 and 19, for example, a tool for inserting a U-shaped staple into objects and for fixing the objects by bending an edge of the U-shaped staple is used (for example, a stapler). In addition, a machine (for example, a sewing machine) for sewing paper or the like is preferably used.

The conductive layers 18 and 19 are provided so as not to overlap with the plurality of thin film transistors 14. In addition, the conductive layers 18 and 19 are provided to have U-shape. Therefore, the stack including the plurality of transistors 14 and the substrate 36 can be fixed to each other firmly.

By providing the conductive layers 18 and 19, the conductive layer 20 and the conductive layer 25 can be electrically connected to the conductive layer 33 and the conductive layer 34, respectively. Further, by providing the conductive layers 18 and 19, the stack including the plurality of transistors 14 and the substrate 36 provided with the conductive layers 33 and 34 can be fixed to each other firmly. In addition, by providing the conductive layers 18 and 19, resistance values between the conductive layer 20 and the conductive layer 33, and between the conductive layer 25 and the conductive layer 34 are lowered, and thus power consumption can be reduced.

In addition, there is a case where the stack including the plurality of transistors 14 is fixed to an article (for example, paper money or the like). In such a case, the conductive layers 18 and 19 are preferably provided so as to penetrate the article as well as the insulating layers 13, 15, 16, 17, the conductive layer 20, the insulating layers 28 and 35, the conductive layer 33, and the substrate 36. Accordingly, the stack including the plurality of transistors 14 can be fixed to the article.

Among the above-mentioned advantages, the advantage that power consumption can be reduced is a useful advantage for the semiconductor device capable of transmitting and receiving data wirelessly. This is because the semiconductor device capable of transmitting and receiving data wirelessly generates a power supply by using an electrical signal of alternating current supplied by an antenna; therefore, a stable power supply is difficult and it is required to control power consumption as much as possible. Provided that power consumption is increased, it is necessary to input a powerful electromagnetic wave. Therefore, defects such as the increase of power consumption of a reader/writer, adverse effect on another device or a human body may arise, or limitation may arise in communication distance between the semiconductor device and the reader/writer.

Figure 7A:
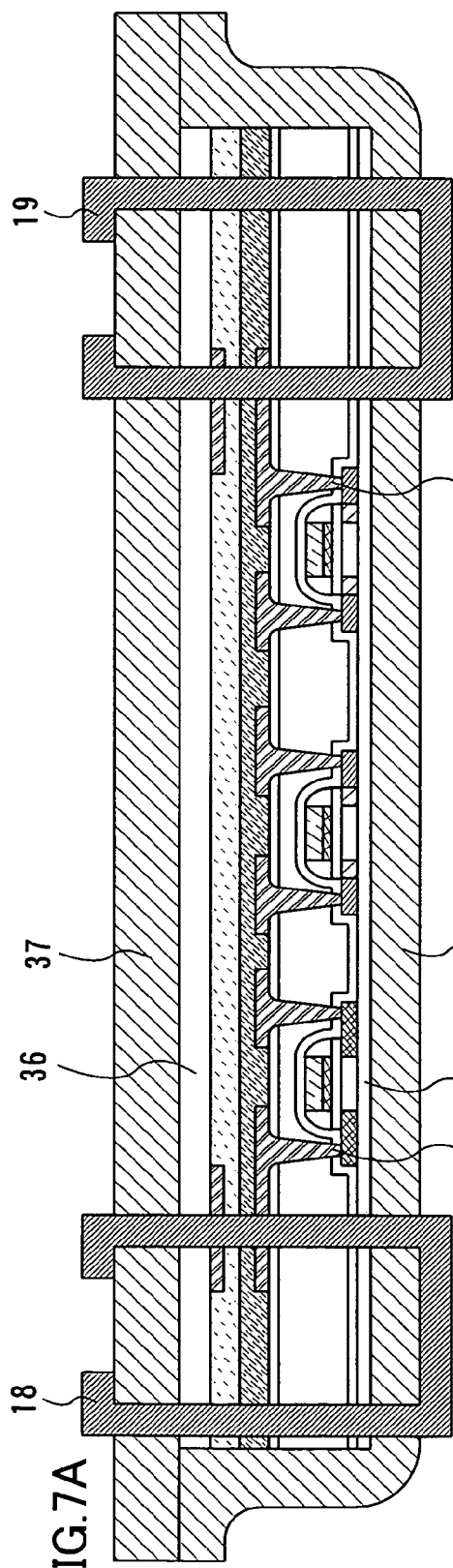
FIGS. 7A and 7B are diagrams illustrating a semiconductor device of the present invention.
Figure 7B:
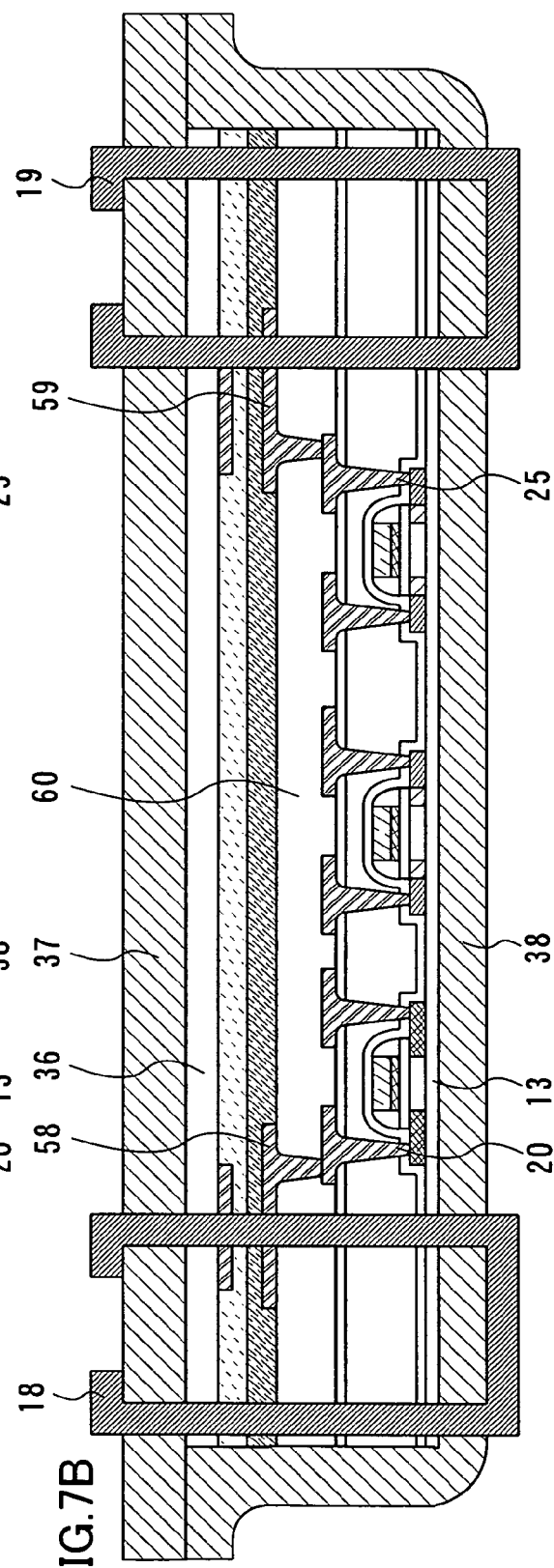

Note that in the above-mentioned semiconductor device (see FIG. 4), the stack including the plurality of transistors 14 may be sealed further by a substrate (see FIG. 7A). Specifically, either or both of surfaces of the substrate 36 and the insulating layer 13 is/are additionally provided with another substrate. In the structure shown in the drawing, a substrate 37 is provided over the surface of the substrate 36 and a substrate 38 is provided over the surface of the insulating layer 13 so as to seal the stack including the plurality of transistors 14 with the substrates 37 and 38. The stack including the plurality of transistors 14 is sealed with the substrates 37 and 38 so that intensity can be improved. Note that in the structure shown in the drawing, the conductive layers 18 and 19 are provided after the stack including the plurality of transistors 14 is sealed with the substrates 37 and 38; however, the present invention is not limited to this structure. The conductive layers 18 and 19 may be provided before the stack including the plurality of transistors 14 is sealed with the substrates 37 and 38.

Each of the substrates 37 and 38 (also called a base, a film, or a tape) is a flexible substrate. Each of the substrates 37 and 38 is formed of a material such as polyethylene, polypropylene, polystyrene, an AS resin, an ABS resin (a resin in which acrylonitrile, butadiene, and styrene are polymerized), a methacryl resin (also called acrylic), polyvinyl chloride, polyacetal, polyamide, polycarbonate, modified polyphenylene ether, polybutylene terephthalate, polyethylene terephthalate, polysulfone, polyethersulfone, polyphenylene sulfide, polyamide-imide, polymethylpentene, a phenol resin, a urea resin, a melamine resin, an epoxy resin, a diallyl phthalate resin, an unsaturated polyester resin, polyimide, or polyurethane, or a fibrous material (for example, paper). A single film or a stacked film of a plurality of films may be used as the film. In addition, an adhesive layer may be provided on the surface thereof. The adhesive layer is a layer containing an adhesive agent.

Surfaces of the substrates 37 and 38 may be coated with powder of silicon dioxide (silica). By the coating, a waterproof property can be secured even when the substrates 37 and 38 are in an atmosphere with a high temperature and a high humidity. In addition, the surfaces may be coated with a conductive material such as indium tin oxide. Such a coating material charges static electricity and thus a thin film integrated circuit can be protected from the static electricity. In addition, the surfaces may be coated with a material containing carbon as its main component (for example, diamond like carbon). By the coating, strength is improved, and thus deterioration and breakdown of a semiconductor device can be suppressed. In addition, the substrates 37 and 38 may be formed of a material in which the base material (for example, a resin) is mixed with silicon dioxide, a conductive material, or a material containing carbon as its main component.

The stack including the plurality of transistors 14 is sealed with the substrates 37 and 38 by melting surface layers of the substrates 37 and 38 or adhesive layers on the surfaces of the substrates 37 and 38 by heat treatment. Further, pressure treatment is conducted for attachment, if necessary.

In addition, in the semiconductor device with the above-mentioned structure (see FIG. 7A), the conductive layers 18 and 19 are provided between the conductive layers 20 and 33 and between the conductive layers 25 and 34, respectively; however, the present invention is not limited to this structure. An insulating layer 60 is provided over the conductive layers 20 to 25, and conductive layers 58 and 59 may be provided to be connected to the conductive layers 20 and 25 through an opening provided in the insulating layer 60. Then, the conductive layers 18 and 19 may be provided between the conductive layers 58 and 33 and between the conductive layers 59 and 34, respectively.

Figures 8A, 8B:
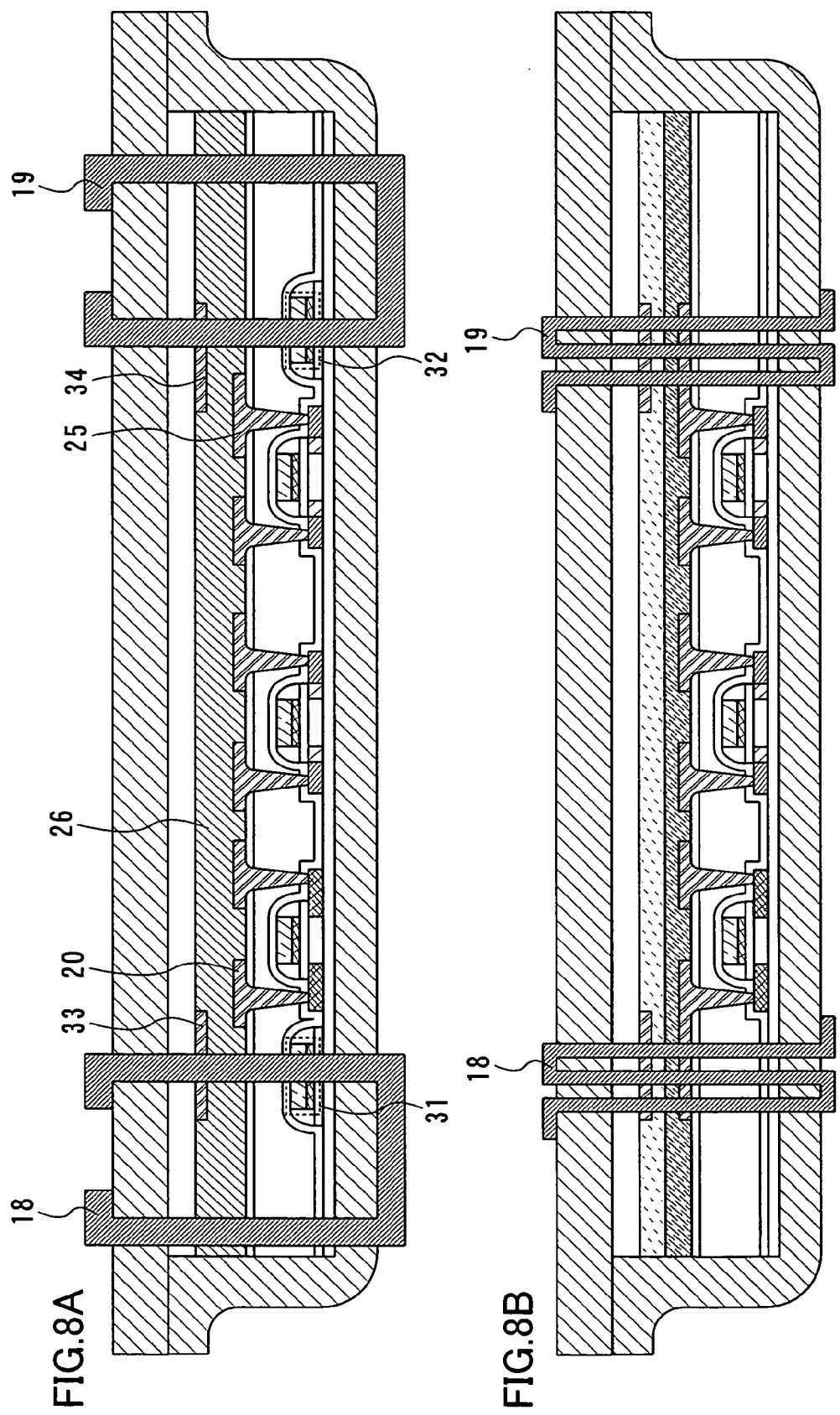
FIGS. 8A and 8B are diagrams illustrating a semiconductor device of the present invention.

Further, in the semiconductor device with the above-mentioned structure (see FIG. 7A), two insulating layers (the insulating layers 28 and 35) are provided between the conductive layers 20, 25 and the conductive layers 33, 34, respectively; however, the present invention is not limited to this structure. Only one insulating layer (an insulating layer 26) may be provided between the conductive layers 20, 25 and the conductive layers 33, 34 (see FIG. 8A). Note that the insulating layer 26 is formed of an insulating material, a material having an adhesive property, an anisotropic conductive material, or the like. In this manner, by providing only one insulating layer, the number of manufacturing steps is reduced and manufacturing cost can be reduced. In addition, a thin shape can be realized.

In addition, in the semiconductor device with the above-mentioned structure (see FIG. 7A), the conductive layer 18 is provided so as to be electrically connected to the conductive layer 20 and the conductive layer 33, and the conductive layer 19 is provided so as to be electrically connected to the conductive layer 25 and the conductive layer 34. The conductive layers 20 and 25 are a source wiring or a drain wiring connected to a source electrode or a drain electrode of a transistor, or a conductive layer provided on the same layer as the source wiring or the drain wiring. However, the present invention is not limited to this structure. Conductive layers 31 and 32 provided on the same layer as the gate electrode of the transistor may be used instead of the conductive layers 20 and 25. Then, the conductive layer 18 may be provided so as to be electrically connected to the conductive layer 31 and the conductive layer 33, and the conductive layer 19 may be provided so as to be electrically connected to the conductive layer 32 and the conductive layer 34.

Further, in the semiconductor device with the above-mentioned structure (see FIG. 7A), the number of through-holes (also called apertures, holes, and openings) of the conductive layers 18 and 19 is two; however, the present invention is not limited to this structure. The number of the through-holes of the conductive layers 18 and 19 may be two or more (see FIG. 8B). A machine (for example, a sewing machine) for sewing paper or the like is preferably used in order to provide two or more through-holes. In addition, a flexible conductive material may be used as the conductive layers 18 and 19. By providing two or more through-holes, the stack including the plurality of transistors 14 and the substrate 36 provided with the conductive layers 33 and 34 can be fixed to each other firmly.

Unlike the semiconductor device with the above-mentioned structure (see FIG. 7A), the insulating layers 28 and 35 may be provided selectively, and a bump 65 may be provided between the conductive layer 20 and the conductive layer 33 (see FIG. 9A). In addition, a bump 66 may be provided between the conductive layer 25 and the conductive layer 34.

Unlike the semiconductor device with the above-mentioned structure (see FIG. 7A), the insulating layer 28 may be provided selectively, and the insulating layer 35 may be replaced with a resin layer 74 including conductive particles 73. Then, the bump 65 and the resin layer 74 may be provided between the conductive layer 20 and the conductive layer 33 (see FIG. 9B). In addition, the bump 66 and the resin layer 74 may be provided between the conductive layer 25 and the conductive layer 34. Note that the resin layer 74 including the conductive particles 73 is an anisotropic conductive layer.

Unlike the semiconductor device with the above-mentioned structure (see FIG. 7A), the insulating layers 28 and 35 may be provided selectively, and bumps 68 and 69 may be provided between the conductive layer 20 and the conductive layer 33 (see FIG. 10A). Further, bumps 70 and 71 may be provided between the conductive layer 25 and the conductive layer 34.

Unlike the semiconductor device with the above-mentioned structure (see FIG. 7A), the insulating layer 28 may be provided selectively, and the insulating layer 35 may be replaced with the resin layer 74 including the conductive particles 73. Then, the bump 68, the resin layer 74 including the conductive particles 73, and the bump 69 may be provided between the conductive layer 20 and the conductive layer 33 (see FIG. 10B). In addition, the bump 70, the resin layer 74, and the bump 71 may be provided between the conductive layer 25 and the conductive layer 34.

One of gold, silver, and copper is used for the bump; however, silver with low resistance value is preferably used.

Embodiment Mode 3

In the above-mentioned embodiment mode, the stack including the plurality of transistors 14 is separated from the substrate 10 (see FIG. 3B); however, the present invention is not limited to this mode.

After forming the conductive layers 20 to 25 (FIG. 1A), a layer for protecting the conductive layers 20 to 25 may be formed over the conductive layers 20 to 25 if necessary. Then, the other surface of the substrate 10 may be ground by using a grinding device. It is preferable that the substrate 10 be ground until the thickness thereof becomes 100 μm or less. The grinding device is, for example, a grinding machine or a grindstone.

Next, the other surface of the ground substrate 10 may be polished by using a polishing device. It is preferable that the substrate 10 be polished until the thickness thereof becomes 50 μm or less, more preferably 20 μm or less, and further preferably 5 μm or less. The polishing device is, for example, a polishing pad or an abrasive grain (for example, cerium oxide or the like). After the grinding step and the polishing step, either or both of a washing step for removing dust and a drying step is/are conducted, if necessary.

The thickness of the polished substrate 10 is preferably determined appropriately in consideration of the time required for the grinding step and the polishing step, the time required for the cutting step to be conducted later, the intended purpose of the semiconductor device, the strength required for the intended purpose of the semiconductor device, and the like. For example, in the case of improving the productivity by shortening the time of the grinding step and the polishing step, the thickness of the polished substrate 10 is preferably about 50 μm. In the case of improving the productivity by shortening the time required for the cutting step to be conducted later, the thickness of the polished substrate 10 is preferably 20 μm or less, and more preferably 5 μm or less. In the case of attaching the semiconductor device to a thin article or embedding the device into a thin article, the thickness of the polished substrate 10 is preferably 20 μm or less, and more preferably 5 μm or less.

Figure 22:
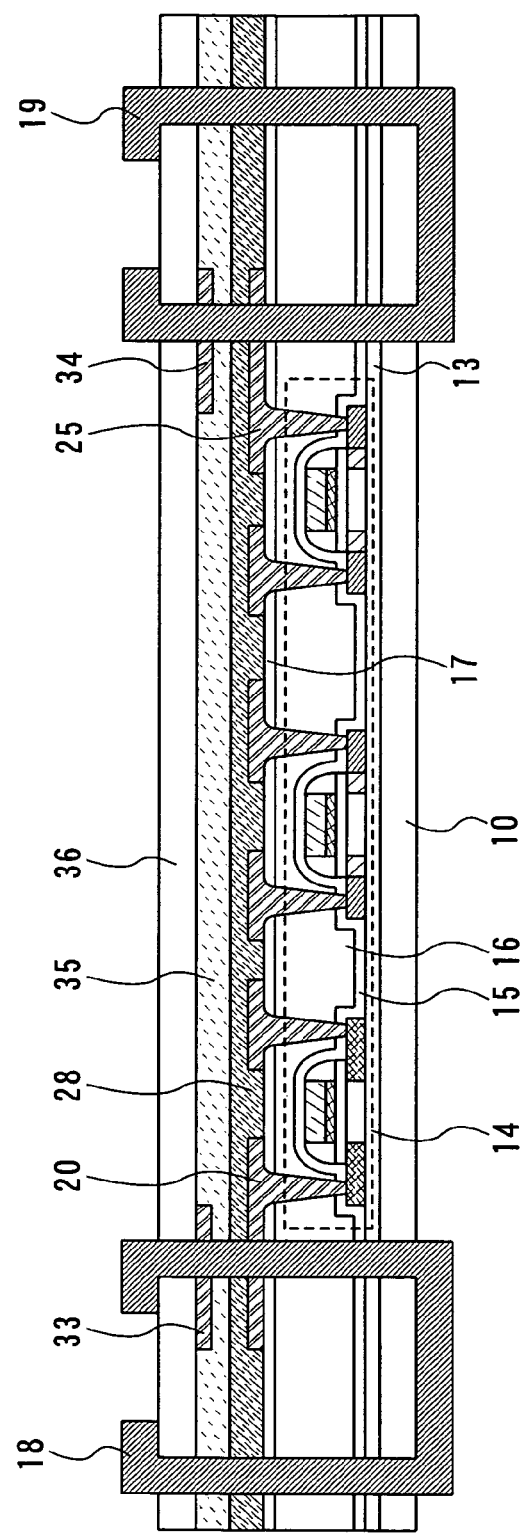
FIG. 22 is a diagram illustrating a semiconductor device of the present invention.

Next, the insulating layer 28 is formed over the conductive layers 20 to 25 (see FIG. 1B). Subsequently, the insulating layer 35 is formed over the insulating layer 28 without forming the openings 29 (see FIG. 2B). Next, the substrate 36 provided with the conductive layers 33 and 34 is prepared. Next, the substrate 36 provided with the conductive layers 33 and 34 is formed over the insulating layer 35. Subsequently, the conductive layer 18 is provided so as to be electrically connected to the conductive layer 20 and the conductive layer 33, and the conductive layer 19 is provided so as to be electrically connected to the conductive layer 25 and the conductive layer 34 (see FIG. 22). The conductive layer 18 is provided so as to penetrate the conductive layer 20 and the conductive layer 33, and the conductive layer 19 is provided so as to penetrate the conductive layer 25 and the conductive layer 34. In this manner, the substrate 10 may be kept remained without separating the substrate 10 from the stack including the plurality of transistors 14. By keeping the substrate 10 remained, it is possible to prevent the intrusion of harmful gas, water, and an impurity element. Therefore, the deterioration and breakdown can be suppressed and the reliability can be enhanced.

Note that the step of separating the substrate 10 in Embodiment Mode 2 may be replaced with a step of grinding and polishing the substrate 10 as in this embodiment mode. Moreover, the barrier property can be enhanced by grinding and polishing the substrate 10.

Embodiment Mode 4

Figure 4:
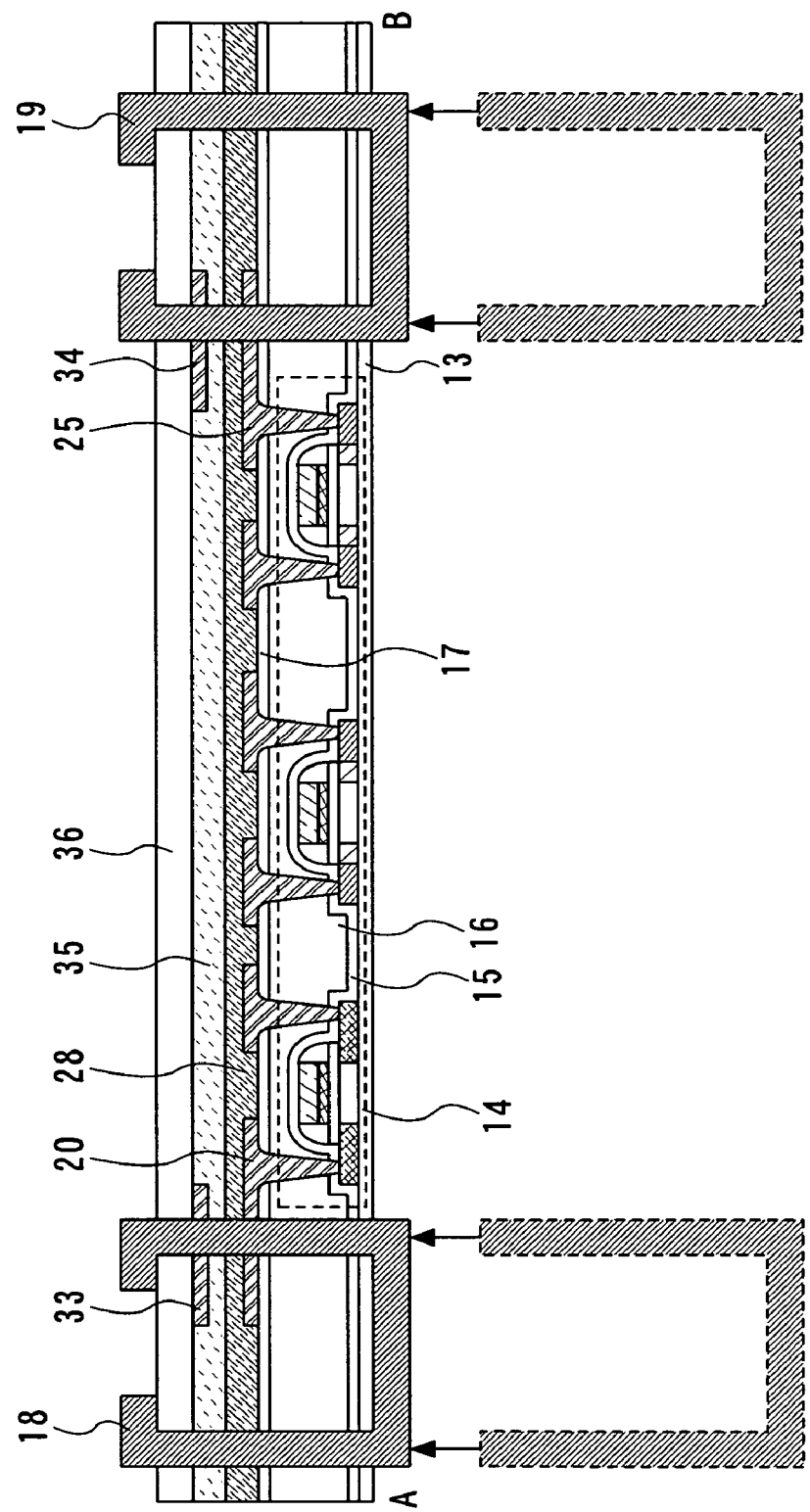
FIG. 4 is a diagram illustrating a semiconductor device of the present invention.

In the above-mentioned embodiment mode, the substrate 10 is separated from the stack including the plurality of transistors 14 (see FIG. 3B), and then, the conductive layers 18 and 19 are provided (see FIG. 4). However, the present invention is not limited to this mode. The substrate 10 is separated from the stack including the plurality of transistors 14 (see FIG. 3B), and next, a stack 44 including a substrate 42 and a plurality of transistors 43 may be provided over the surface of the insulating layer 13 (see FIG. 11A). Then, the insulating layer 13 and an insulating layer 45 may be s attached to each other by performing either or both of pressure treatment and heat treatment, if necessary. The insulating layer 45 is formed of an adhesive agent or an anisotropic conductive material.

Figure 12:
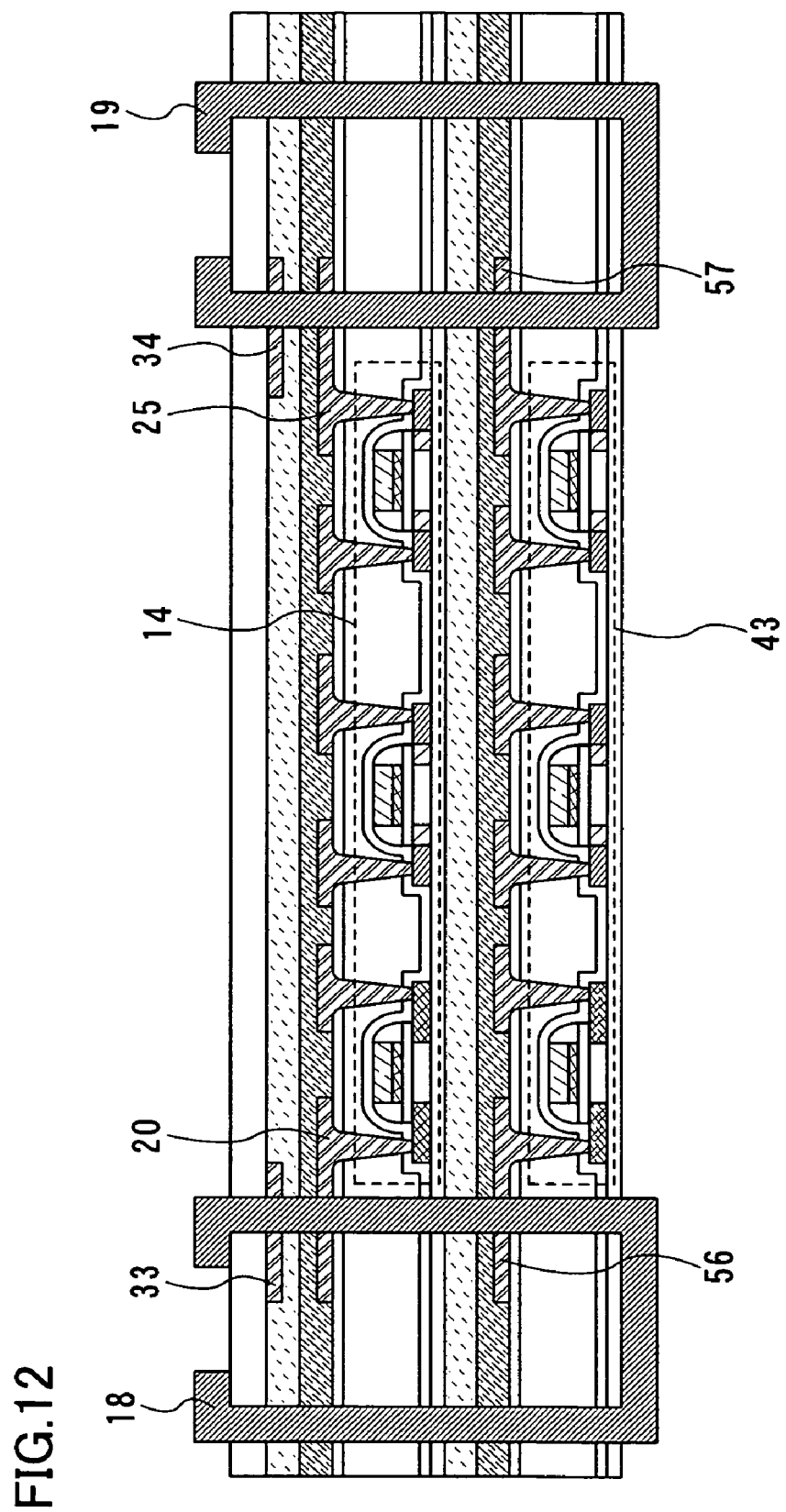
FIG. 12 is a diagram illustrating a semiconductor device of the present invention.

Subsequently, the substrate 42 may be separated from the stack 46 including the plurality of transistors 43 by using the substrate 36 (see FIG. 11B). In the structure shown in the drawing, the substrate 42 is separated from the stack 46 at a boundary between a separation layer 47 and an insulating layer 48. Next, the conductive layer 18 penetrating the conductive layers 33, 20, and 56, and the conductive layer 19 penetrating the conductive layers 34, 25, and 57 may be provided (see FIG. 12).

By the above-mentioned structure, the semiconductor device in which the plurality of transistors are stacked can be provided. By stacking the plurality of transistors, the number of transistors to be included in one semiconductor device can be increased, so that a semiconductor device with high performance can be provided.

Embodiment 1

A substrate provided with a conductive layer will be described with reference to FIGS. 13A and 13B. Two examples of the substrate provided with a conductive layer are described below. The conductive layer functions as an antenna or a connection wire.

As an example thereof, the conductive layers 33 and 34 are provided over the substrate 36 (see FIG. 13A). The substrate 36 is formed of polyimide, PET (polyethylene terephthalate), PEN (polyethylene naphthalate), PC (polycarbonate), PES (polyethersulfone), or the like. The conductive layers 33 and 34 are formed of copper, silver, or the like. In addition, exposed portions of the conductive layers 33 and 34 are plated with gold or the like for protection against oxidation.

As another example, the conductive layers 33 and 34 and a protection layer 39 are provided over the substrate 36 (see FIG. 13B). The protection layer 39 can be formed of either or both of a substrate or an insulating resin. The substrate is formed of polyimide, PET (polyethylene terephthalate), PEN (polyethylene naphthalate), PC (polycarbonate), or PES (polyethersulfone). The insulating resin corresponds to an epoxy resin, a silicone resin, a synthetic rubber resin, or the like.

Note that in the case where the conductive layers 33 and 34 over the substrate 36 function as an antenna, the shapes of the conductive layers 33 and 34 are not limited particularly. As for the shape, there are, for example, a dipole, an annular shape (for is example, a loop antenna), a spiral shape, a flat shape with a rectangular solid (for example, a patch antenna) and the like. In addition, a material for forming the conductive layers 33 and 34 is not limited particularly. As for the material, for example, gold, silver, copper, or the like may be used, and among them, silver with low resistance value is preferably used. In addition, its manufacturing method is not limited particularly, and a sputtering method, a CVD method, a screen printing method, a droplet discharge method (for example, an inkjet method), a dispenser method or the like may be used.

Note that when an antenna is directly attached to a metal surface, an eddy current is generated in the metal by magnetic flux passing through the metal surface. Such an eddy current is generated in a direction opposite to a magnetic field of a reader/writer. Thus, ferrite having high magnetic permeability and a low high-frequency loss or a metal thin film sheet is preferably interposed between the antenna and the conductive layer, thereby preventing generation of the eddy current.

Note that in the above-mentioned embodiment mode, the substrate provided with the conductive layer is used and either of the above-mentioned substrates may be used for such a substrate provided with the conductive layer.

Embodiment 2

Figure 14:
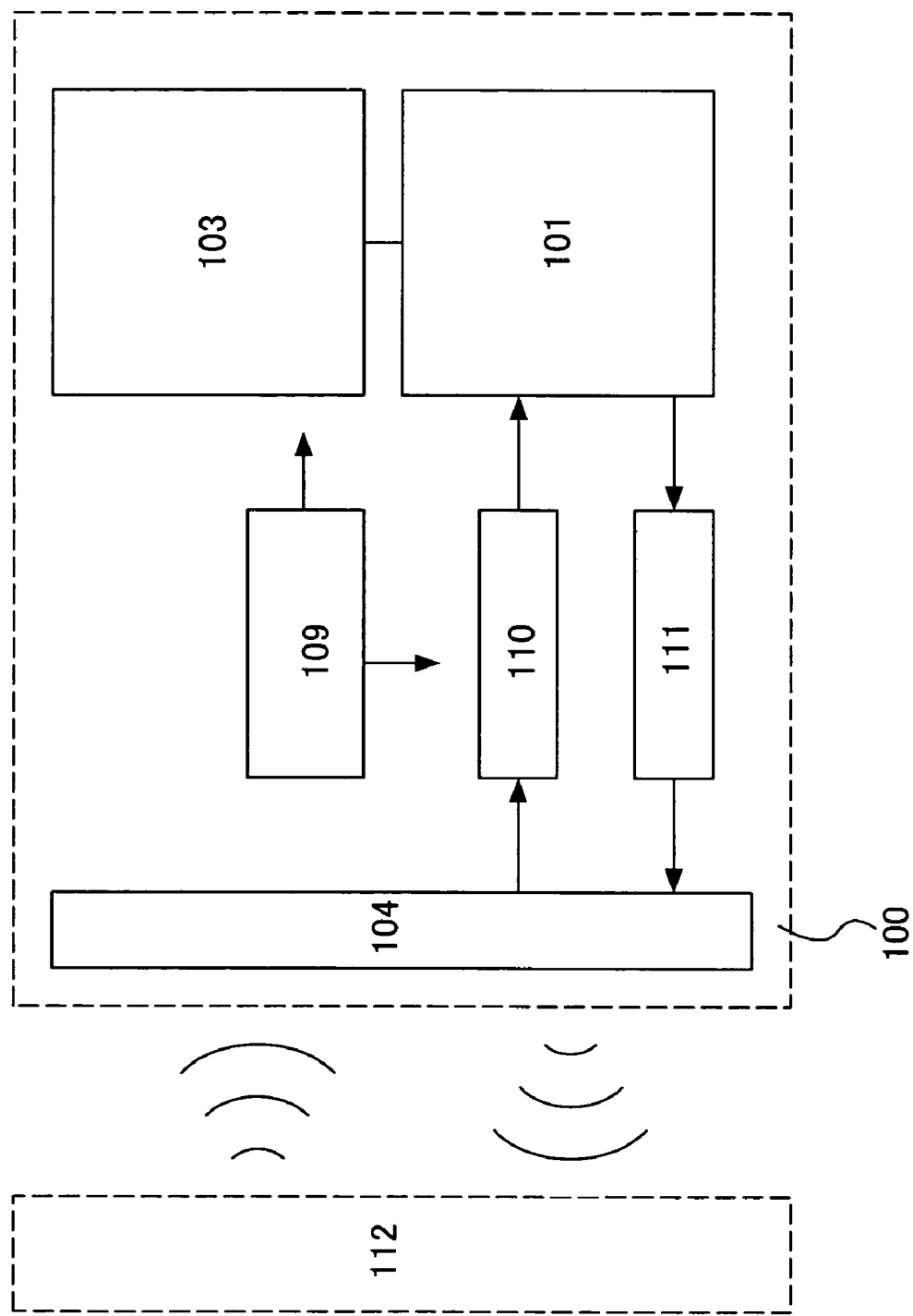
FIG. 14 is a diagram illustrating a semiconductor device of the present invention.

A structure of a semiconductor device of the present invention will be described with reference to FIG. 14. A semiconductor device 100 of the present invention includes an arithmetic processing circuit 101, a memory circuit 103, an antenna 104, a power supply circuit 109, a demodulation circuit 110, and a modulation circuit 111. The semiconductor device 100 necessarily includes the antenna 104 and the power supply circuit 109. Other elements are provided as appropriate in accordance with the usage of the semiconductor device 100.

The arithmetic processing circuit 101 analyzes command, controls the memory circuit 103, outputs data to be transmitted to the outside into the modulation circuit 111, or the like, based on a signal input from the demodulation circuit 110.

The memory circuit 103 includes a circuit including a memory element, and a control circuit for controlling writing and reading of data. In the memory circuit 103, at least an identification number for the semiconductor device itself is stored. The identification number is used for distinguishing the semiconductor device from other semiconductor devices. In addition, the memory circuit 103 includes one kind or a plurality of kinds of memory, selected from among an organic memory, a DRAM (Dynamic Random Access Memory), an SRAM (Static Random Access Memory), a FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), or a flash memory. The organic memory has a structure in which a layer containing an organic compound is interposed between a pair of conductive layers. Since the organic memory has a simple structure, manufacturing process can be simplified and cost can be reduced. In addition, due to the simple structure, an area of a stack can be reduced and large capacity can be easily realized. Further, it is also an advantage that the organic memory is nonvolatile and does not require incorporation of a battery. Accordingly, it is preferable that the organic memory be used as the memory circuit 103.

The antenna 104 converts a carrier wave provided from a reader/writer 112 into an alternating electrical signal. In addition, load modulation is applied from the modulation circuit 111. The power supply circuit 109 generates power voltage by using the alternating electrical signal converted by the antenna 104 and supplies power voltage to each circuit.

The demodulation circuit 110 demodulates the alternating electrical signal converted by the antenna 104 and supplies the demodulated signal to the arithmetic processing circuit 101. The modulation circuit 111 applies load modulation to the antenna 104, based on the signal supplied from the arithmetic processing circuit 101.

The reader/writer 112 receives the load modulation applied to the antenna 104 as a carrier wave. In addition, the reader/writer 112 transmits the carrier wave to the semiconductor device 100. Note that the carrier wave refers to an electromagnetic wave which is generated by the reader/writer 112.

Embodiment 3

Figure 15A:
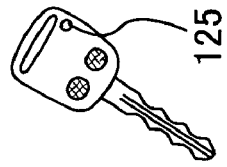
FIGS. 15A to 15E are diagrams illustrating a semiconductor device of the present invention.
Figure 15C:
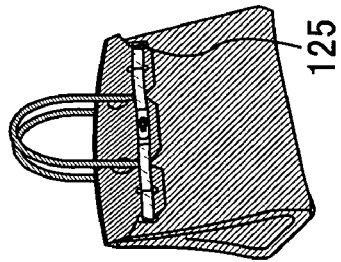
Figure 15E:
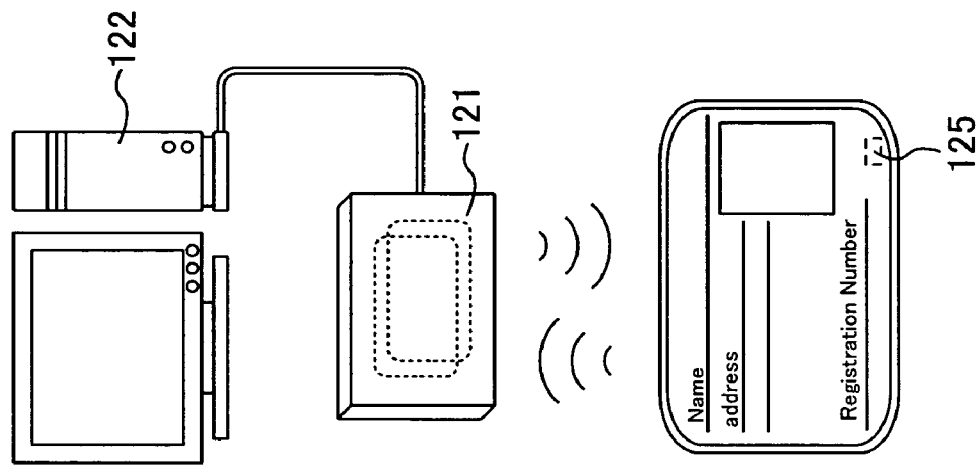
Figure 15B:
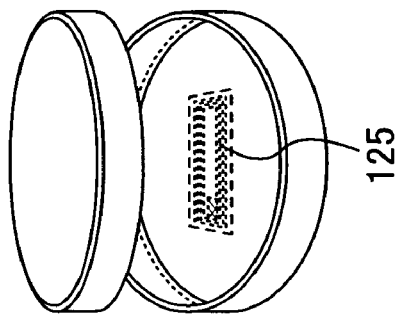
Figure 15D:
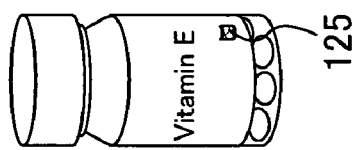

A semiconductor device 125 of the present invention can be used in various articles and various systems by utilizing the function of transmitting and receiving data wirelessly. As examples of articles, keys (see FIG. 15A), paper money, coins, securities, bearer bonds, certificates (a driver's license, resident's card, or the like), books, containers (a petri dish or the like, see FIG. 15B), personal accessories and ornaments (bags, glasses, or the like, see FIG. 15C), packing and wrapping containers (wrapping paper, bottles, or the like, see FIG. 15D), recording media (a disk, a video tape, or the like), vehicles (a bicycle or the like), foods, clothing, everyday articles, electronic devices (a liquid crystal display device, an EL display device, a television device, a portable terminal, or the like), or the like can be given. Note that the semiconductor device of the present invention is fixed to articles of various forms as described above by being attached to a surface of an article or by being embedded into an article.

In addition, "system" refers to a physical distribution inventory management system, an authentication system, a distribution system, a production record system, a book management system, or the like. By using the semiconductor device of the present invention, sophistication, multifunctionality, and high added value of the system can be achieved. For example, the semiconductor device of the present invention is provided inside an identification card, and a reader/writer 121 is provided at an entrance of a building or the like (see FIG. 15E). The reader/writer 121 reads an identification number which is inside the identification card that every person possesses and supplies information connected with the identification number that has been read to a computer 122. The computer 122 determines whether or not to authorize the person's entrance or exit, based on the information provided from the reader/writer 121. In this way, by using the semiconductor device of the present invention, an entrance-exit management system having the improved convenience can be provided.

Embodiment 4

A manufacturing method of a transistor which is included in the semiconductor device of the present invention will be described with reference to FIGS. 16A to 18B. First, an insulating layer 552 is formed over a substrate 551 (see FIG. 16A). Next, an insulating layer 553 is formed over the insulating layer 552. Then, a semiconductor layer 554 is formed over the insulating layer 553. In addition, a gate insulating layer 555 is formed over the semiconductor layer 554.

The semiconductor layer 554 is formed through the manufacturing process described below, for example. First, an amorphous semiconductor layer is formed by a sputtering method, an LPCVD method, a plasma CVD method, or the like. Next, the amorphous semiconductor layer is crystallized by a laser crystallization method, an RTA (Rapid Thermal Anneal) method, a thermal crystallization method using an annealing furnace, a thermal crystallization method using a metal element promoting crystallization, a method in which the thermal crystallization method using a metal element promoting crystallization and the laser crystallization method are combined, or the like, to form a crystalline semiconductor layer. Then, the crystalline semiconductor layer obtained is patterned (pattern processing) to form a desired shape.

The semiconductor layer 554 is preferably formed by a combination of a crystallization method including thermal treatment and a crystallization method in which irradiation of a continuous wave laser or a laser beam oscillating with a frequency of 10 MHz or more is conducted. By irradiating the semiconductor layer 554 with a continuous wave laser or a laser beam oscillating with a frequency of 10 MHz or more, a surface of the crystallized semiconductor layer 554 can be planarized. In addition, by planarizing the surface of the semiconductor layer 554, the gate insulating layer 555 can be thinned. Further, the pressure-resistance of the gate insulating layer 555 can be increased.

In addition, the gate insulating layer 555 may be formed by performing plasma treatment to the semiconductor layer 554, in which oxidation or nitridation of the surface of the semiconductor layer 554 is performed. For example, plasma treatment may be employed, in which a mixed gas containing a rare gas such as He, Ar, Kr, or Xe, and oxygen, oxidized nitrogen, ammonia, nitrogen, hydrogen, or the like is introduced. In this case, excitation of plasma is preferably performed by introducing a microwave. This is because by introducing the microwave, plasma with a high density and a low electron temperature can be generated. The surface of the semiconductor layer 554 can be oxidized or nitrided by oxygen radicals (OH radicals may be included) or nitrogen radicals (NH radicals may be included) generated with this high density plasma, so that the gate insulating layer 555 can be formed. In other words, an insulating layer with a thickness of 1 to 20 nm, typically 5 to 10 nm is formed over the surface of the semiconductor layer 554 by such a treatment using a high density plasma. Since the reaction in this case is a solid-phase reaction, an interface state density between the insulating layer 555 and the semiconductor layer 554 can be made extremely low.

In such a high density plasma treatment, since a semiconductor layer (crystalline silicon or polycrystalline silicon) is directly oxidized (or nitrided), variation in the thickness of a gate insulating layer to be formed over the surface of the semiconductor layer can be made extremely small. In addition, since strong oxidation is not generated in a crystal grain boundary of crystalline silicon, an extremely preferable state is made. In other words, in the high density plasma treatment described herein, by solid-phase oxidizing the surface of the semiconductor layer 554, the gate insulating layer 555 can be formed to have good uniformity and low interface state density, without excessive oxidation in a crystal grain boundary.

As for the gate insulating layer 555, just the insulating layer formed by high density plasma treatment may be used, or an insulating layer of silicon oxide, silicon oxynitride, silicon nitride, or the like may be stacked over the insulating layer by a CVD method using plasma or thermal reaction. In either case, variation of characteristics can be reduced in a transistor including the insulating layer formed by using high density plasma as the gate insulating layer 555 or as a part of the gate insulating layer 555.

Further, the semiconductor layer 554 which is crystallized by scanning in one direction with a continuous wave laser or a laser beam oscillating at a frequency of 10 MHz or more, has a characteristic that crystals in the semiconductor layer are grown in a scanning direction of the beam. A transistor having small variation of characteristics and high field effect mobility can be obtained by positioning an active layer of the transistor so as to align a channel length direction of the active layer (a direction in which carriers are flown when a channel forming region is formed) with the scanning direction and by employing the method described above to form a gate insulating layer.

Note that the insulating layers 552 and 553, the semiconductor layer 554, the gate insulating layer 555, and the like are formed by plasma treatment in some cases. Such a plasma treatment is preferably conducted with an electron density of $1 \times 10^{11}$ cm$^{-3}$ or more and a plasma electron temperature of 1.5 eV or less. In more detail, the plasma treatment is preferably conducted with an electron density of $1 \times 10^{11}$ cm$^{-3}$ or more and $1 \times 10^{13}$ cm$^{-3}$ or less and a plasma electron temperature of 0.5 eV or more and 1.5 eV or less.

When plasma has a high electron density, and a low electron temperature in the vicinity of an object to be processed (for example, the insulating layers 552 and 553, the semiconductor layer 554, the gate insulating layer 555, or the like), the object to be processed can be prevented from being damaged from the plasma. In addition, since an electron density of plasma is as high as or more than $1 \times 10^{11}$ cm$^{-3}$, oxide or nitride formed by oxidizing or nitriding an object to be irradiated using plasma treatment is superior in uniformity of film thickness and the like and can be a denser film, compared with a thin film formed by a CVD method, a sputtering method, or the like. In addition, since the electron temperature of the plasma is as low as or less than 1.5 eV, oxidizing treatment or nitriding treatment can be conducted at a lower temperature, compared with conventional plasma treatment or a thermal oxidation method. For example, even when plasma treatment is performed at a temperature 100° C. or more lower than a strain point of a glass substrate, oxidizing treatment or nitriding treatment can be performed sufficiently.

Next, a conductive layer 501 and a conductive layer 503 are stacked over the gate insulating layer 555. Each of the conductive layers 501 and 503 is formed of a metal such as tungsten, chromium, tantalum, tantalum nitride, or molybdenum, or an alloy or a compound containing the metal as its main component. Note that the conductive layer 501 and the conductive layer 503 are formed of different materials to each other. Specifically, the conductive layers 501 and 503 are formed of different materials which cause a difference in an etching rate in an etching step to be performed later.

Then, a mask 506 made of a resist is formed over the conductive layer 503. The mask 506 is formed by using an exposure mask including a shielding film and a translucent film. A specific structure of this mask will be described later.

Figure 16A:
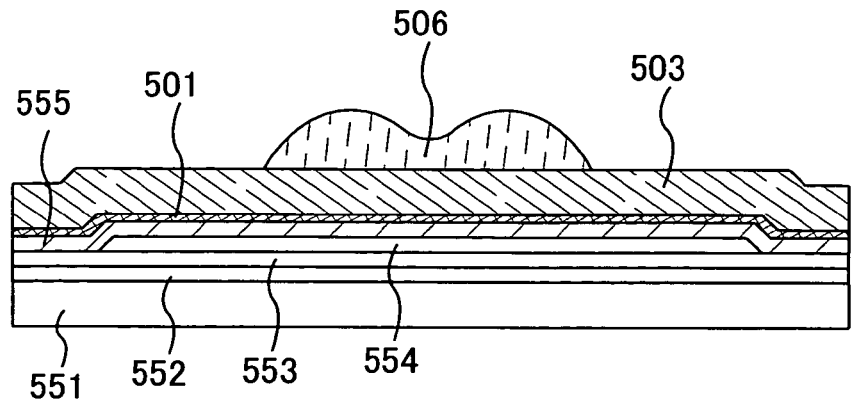
FIGS. 16A to 16D are diagrams illustrating a transistor and a manufacturing method thereof.
Figure 16B:
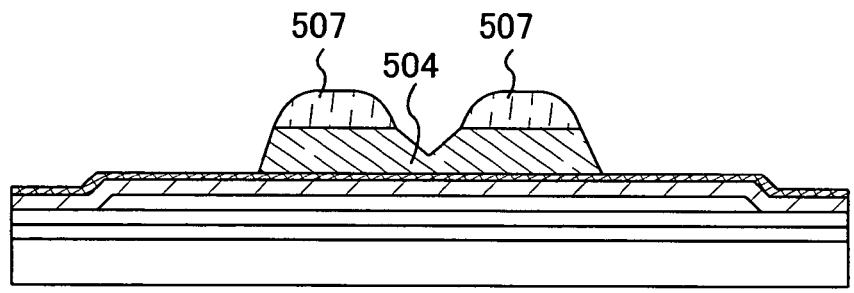
Figure 16C:
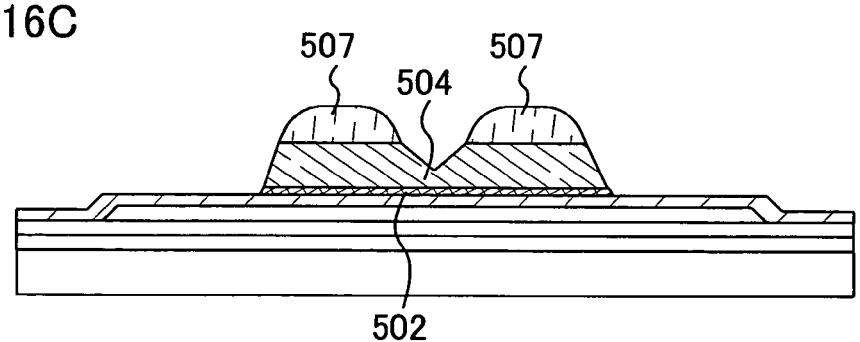

Subsequently, the conductive layer 503 is etched by using the mask 506 to form a mask 507 and a conductive layer 504 (see FIG. 16B). The mask 506 is sputtered by ions accelerated by an electric field. Then, the mask 506 is divided into two masks 507, and the two masks 507 are separately arranged. In addition, the conductive layer 501 is etched by using the masks 507 and the conductive layer 504 to form a conductive layer 502 (see FIG. 16C).

Figure 16D:
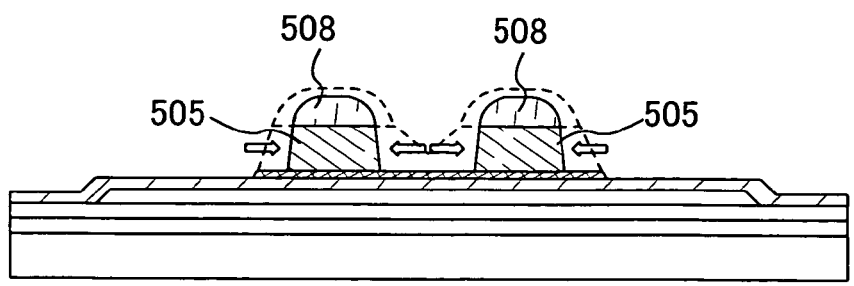

Next, the masks 507 and the conductive layer 504 are selectively etched to form masks 508 and conductive layers 505 (see FIG. 16D). The masks 508 are reduced in size, by being sputtered by ions accelerated by an electric field. In this step, in order to avoid etching the conductive layer 502, bias voltage which is applied to a substrate side is adjusted.

Figure 17A:
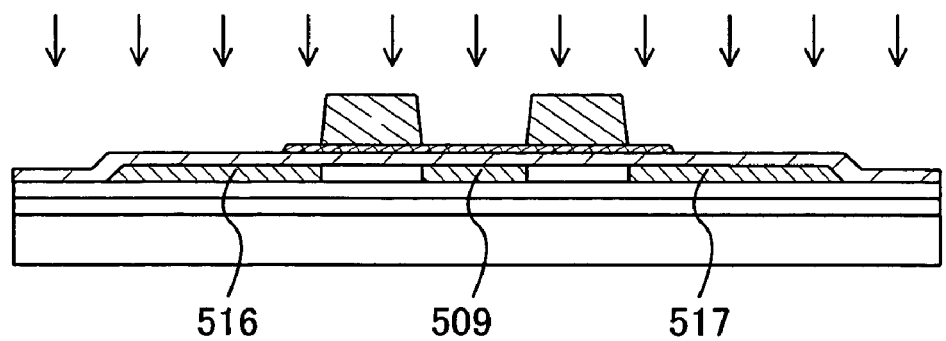
FIGS. 17A to 17C are diagrams illustrating a transistor and a manufacturing method thereof.

Then, the semiconductor layer 554 is doped with an impurity element imparting one conductivity type to form impurity regions 509, 516, and 517 having a first concentration (see FIG. 17A). At this time, the semiconductor layer 554 is doped with an impurity element in a self-aligning manner by using the conductive layer 505.

Figure 17B:
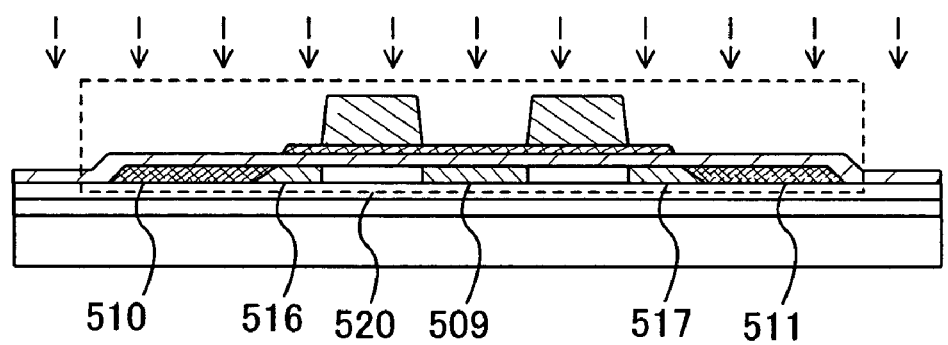

Next, the semiconductor layer 554 is doped with an impurity element imparting one conductivity type to form impurity regions 510 and 511 having a second concentration (see FIG. 17B). Note that a portion of the semiconductor layer 554 which overlaps the conductive layer 505 is not doped with an impurity element imparting one conductivity type. Accordingly, the portion of the semiconductor layer 554 which overlaps with the conductive layer 505 functions as a channel forming region. Through the above-described process, a thin film transistor 520 is completed.

Figure 17C:
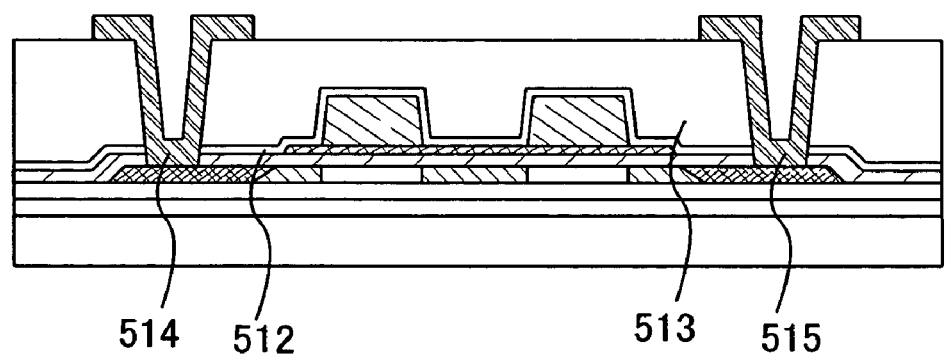

Subsequently, insulating layers 512 and 513 are formed to cover the thin film transistor 520 (see FIG. 17C). Then, conductive layers 514 and 515 are formed to be connected to the impurity regions 510 and 511 having the second concentration through openings provided in the insulating layers 512 and 513.

One feature of the above-described step is to etch the conductive layers 501 and 503 by using the mask 506 having a complicated shape with a nonuniform thickness. By using the mask 506, the masks 507 can be formed to be apart from each other. Thus, the distance between two channel forming regions can be reduced. Specifically, the distance between the two channel forming regions can be less than 2 µm. Accordingly, in the case of forming a multigate thin film transistor including two or more gate electrodes, the space of the transistor can be reduced. Therefore, a sophisticated semiconductor device with high integration can be provided.

Next, a method for forming the mask 506 will be described with reference to FIGS. 18A and 18B. FIG. 18A is an enlarged top view of a part of an exposure mask. FIG. 18B shows a cross-sectional view of the part of the exposure mask corresponding to FIG. 18A and a cross-sectional view of the stack including the substrate 551.

The exposure mask includes a light-transmitting substrate 560, shielding films 561 and 562, and a translucent film 563. The shielding films 561 and 562 each include a metal film of chromium, tantalum, CrN$_x$ (x is a positive integer), or the like. The material of the translucent film 563 is appropriately selected in accordance with the exposure wavelength. For example, TaSi$_x$O$_y$ (x and y are positive integers), CrO$_x$N$_y$ (x and y are positive integers), CrF$_x$O$_y$ (x and y are positive integers), MoSi$_x$N$_y$ (x and y are positive integers), or MoSi$_x$O$_y$ (x and y are positive integers) may be used. The translucent film 563 functions as an auxiliary pattern.

The exposure of a resist mask with the use of the exposure mask having the above-described structure broadly divides the resist mask into a region 521 which is not exposed to light and a region 522 which is exposed to light. When development process is conducted in this state, the resist in the region 522 which is exposed to light is removed, and thus the mask 506 having the shape as shown in FIG. 16A is formed.

Embodiment 5

Figure 19A:
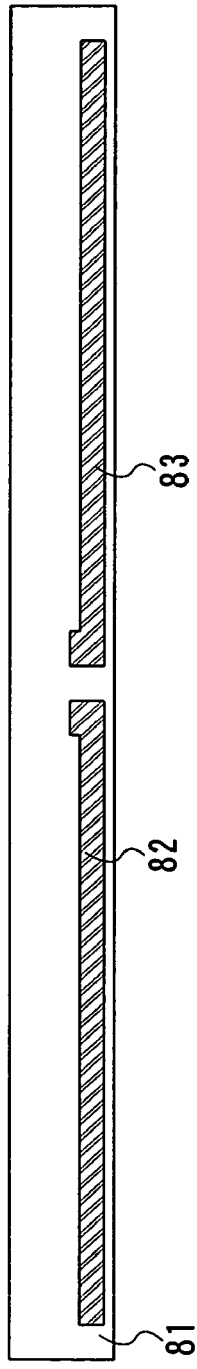
FIGS. 19A to 19D are diagrams illustrating an experimental result.
Figure 19B:
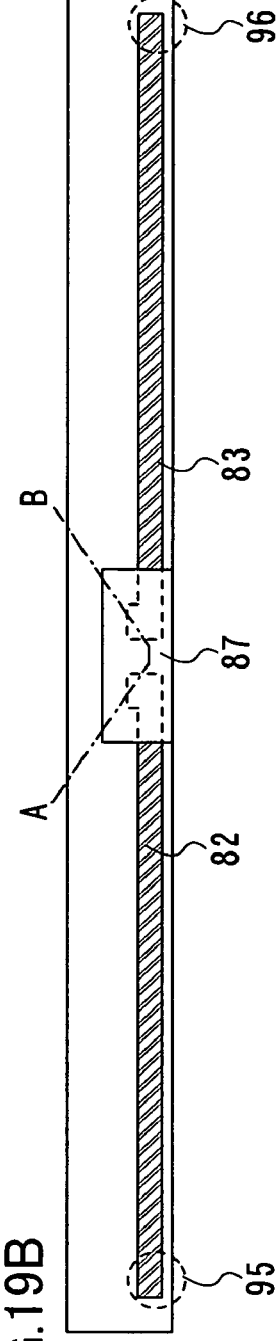
Figure 19D:
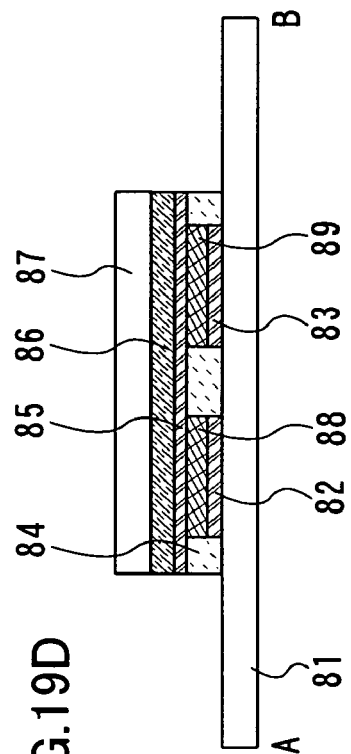
Figure 19C:
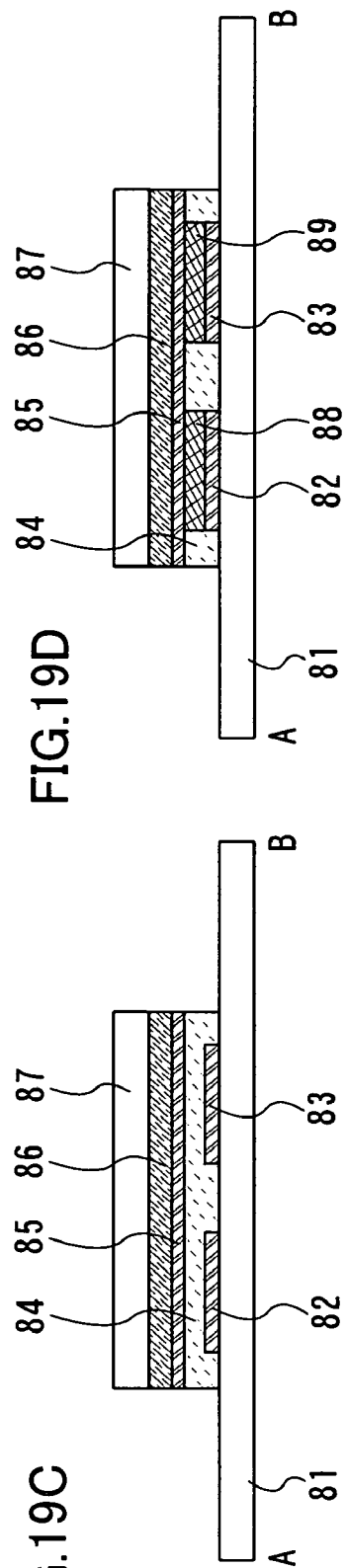
Figure 21A:
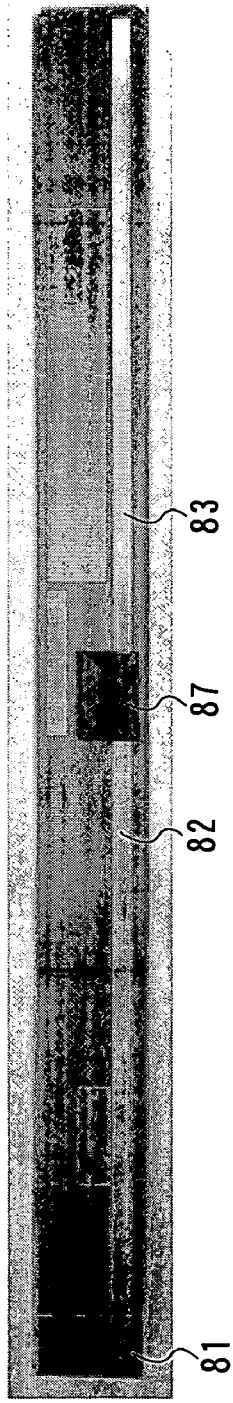
FIGS. 21A to 21C are diagrams illustrating an experimental result.
Figure 21C:
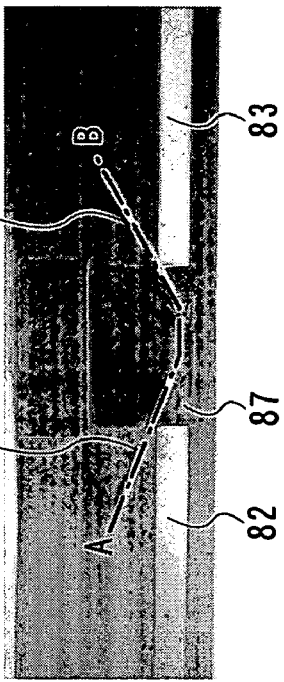
Figure 21B:
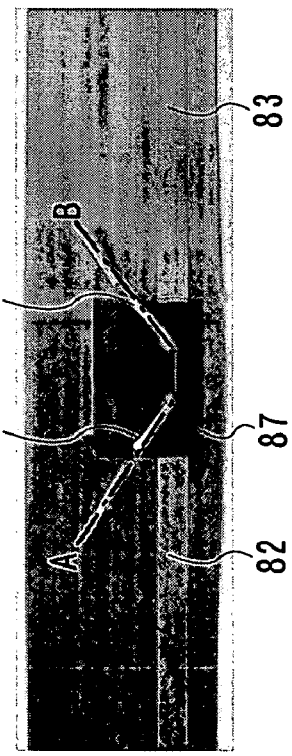

An experimental result using samples A and B will be described with reference to FIGS. 19A to 21C. The samples A and B are semiconductor devices having the same top surface structure and different cross-sectional structures. FIGS. 19A and 19B are top views of the samples A and B, FIG. 19C is a cross-sectional view of the sample A, and FIG. 19D is a cross-sectional view of the sample B. Note that FIGS. 19C and 19D are cross-sectional views along a line from point A to point B of the top view of FIG. 19B. FIG. 20A is a top view of the samples A and B, FIG. 20B is a cross-sectional view of the sample A, and FIG. 20C is a cross-sectional view of the sample B. In addition, FIGS. 20B and 20C are cross-sectional views along a line from point A to point B of the top view of FIG. 20A. Further, FIG. 21A is a top surface photograph of the samples A and B, FIG. 21B is a photograph of the sample A, and FIG. 21C is a photograph of the sample B. FIGS. 21B and 21C are magnified photographs of a central portion of FIG. 21A. Note that FIG. 19B is a conceptual diagram of the top surface photograph of the samples A and B of FIG. 21A. FIG. 20A is a conceptual diagram of the top surface photograph of the sample A of FIG. 21B and the top surface photograph of the sample B of FIG. 21C.

First, two substrates 81 provided with conductive layers 82 and 83 which function as an antenna were prepared (see FIG. 19A). One of the two substrates 81 was used for the sample A, and the other thereof was used for the sample B.

In the sample A, a substrate 87 over which a resin layer 86, a conductive layer 85, and an insulating layer 84 were stacked was attached to the substrate 81 provided with the conductive layers 82 and 83 (see FIGS. 19B and 19C, and a photograph of FIG. 21A). At this time, the conductive layer 82 and the conductive layer 83 were in a state of being connected to each other through the insulating layer 84 and the conductive layer 85, and the resistance value between a node 95 of an edge of the conductive layer 82 and a node 96 of an edge of the conductive layer 83 was 1300 O.

In the sample B, the substrate 87 over which the resin layer 86, the conductive is layer 85, bumps 88 and 89, and the insulating layer 84 were stacked was attached to the substrate 81 provided with the conductive layers 82 and 83 (see FIGS. 19B and 19D, and a photograph of FIG. 21A). At this time, the conductive layer 82 and the conductive layer 83 were in a state of being electrically connected through the bump 88, the conductive layer 85 and the bump 89, and the resistance value between the node 95 and the node 96 was 5.3 O.

Next, a conductive layer 91 which penetrates the substrate 81, the conductive layer 82, the insulating layer 84, the conductive layer 85, the resin layer 86 and the substrate 87 was provided in the Sample A (see FIGS. 20A and 20B, and a photograph of FIG. 21B). In addition, a conductive layer 92 which penetrates the substrate 81, the conductive layer 83, the insulating layer 84, the conductive layer 85, the resin layer 86 and the substrate 87 was provided. In providing the conductive layers 91 and 92, a stapler was used. The conductive layers 91 and 92 are binding staples in the shape of the Japanese katakana letter "ko". Then, the conductive layers 82 and 83 were in a state of being electrically connected through the conductive layer 91, the conductive layer 85 and the conductive layer 92, and at this time, the resistance value between the node 95 and the node 96 was 0.42 O. In this manner, by providing the conductive layers 91 and 92, the resistance value was significantly reduced from 1300 O to 0.42 O.

In addition, a conductive layer 93 which penetrates the substrate 81, the conductive layer 82, the bump 88, the conductive layer 85, the resin layer 86, and the substrate 87 was provided in the Sample B (see FIGS. 20A and 20C, and a photographic of FIG. 21C). In addition, a conductive layer 94 which penetrates the substrate 81, the conductive layer 83, the bump 89, the conductive layer 85, the resin layer 86, and the substrate 87 was provided. In providing the conductive layers 93 and 94, a stapler was used. Then, the conductive layers 82 and 83 were in a state of being electrically connected through the conductive layer 93, the conductive layer 85, and the conductive layer 94, and at this time, the resistance value between the node 95 and the node 96 was 1.71 O. In this manner, by providing the conductive layers 93 and 94, the resistance value was reduced from 5.3 O to 1.71 O.

From the above-mentioned result, by providing a conductive layer, the resistance value can be reduced. When the resistance value can be reduced, power consumption can be reduced.

This application is based on Japanese Patent Application serial no. 2005-191367 filed in Japan Patent Office on Jun. 30, 2005, the entire contents of which are hereby incorporated by reference.

What is claimed is:

1. A semiconductor device comprising:
    a transistor including a semiconductor layer, a first insulating layer, and a first conductive layer;
    a second insulating layer over the transistor;
    a second conductive layer connected to a source or drain of the transistor through an opening provided in the second insulating layer;
    a first terminal portion connected to the first conductive layer or the second conductive layer;
    a third insulating layer over the second insulating layer and the second conductive layer;
    a third conductive layer over the third insulating layer, wherein the third conductive layer functions as an antenna;
    a second terminal portion connected to the third conductive layer;
    a substrate over the third insulating layer and the third conductive layer; and
    a fourth conductive layer penetrating the first terminal portion, the second terminal portion, and the substrate,
    wherein the first terminal portion and the second terminal portion overlap with each other, and
    wherein the first terminal portion is electrically connected to the second terminal portion through the fourth conductive layer.

2. The semiconductor device according to claim 1, wherein the semiconductor device further comprises a bump, and the bump is provided between the first terminal portion and the second terminal portion.

3. The semiconductor device according to claim 1, the semiconductor device further comprising:
    a bump; and
    an anisotropic conductive layer over the bump,
    wherein the bump and the anisotropic conductive layer are provided between the first terminal portion and the second terminal portion.

4. The semiconductor device according to claim 1, the semiconductor device further comprising:
    a first bump;
    an anisotropic conductive layer over the first bump; and a second bump over the anisotropic conductive layer,
wherein the first bump, the anisotropic conductive layer, and the second bump are provided between the first terminal portion and the second terminal portion.

5. A semiconductor device comprising:
a thin film integrated circuit;
a first terminal portion connected to the thin film integrated circuit;
a substrate over which a second terminal portion and a first conductive layer connected to the second terminal portion are provided; and
means for fixing the thin film integrated circuit, the first terminal portion, the second terminal portion, and the substrate and for electrically connecting the first terminal portion and the second terminal portion,
wherein the means is a stainless steel wire which is wiredrawn.

6. The semiconductor device according to claim 5, wherein the thin film integrated circuit has at least one transistor, and the first terminal portion is electrically connected to the at least one transistor.

7. The semiconductor device according to claim 5, wherein the stainless steel wire is a linear shape conductor, a needle-shaped conductor, or a stick conductor.

8. The semiconductor device according to claim 5, wherein the stainless steel wire penetrates the first terminal portion and the second terminal portion.

9. A semiconductor device comprising:
a thin film integrated circuit;
a first terminal portion connected to the thin film integrated circuit;
a substrate over which a second terminal portion and a first conductive layer connected to the second terminal portion are provided; and
means for fixing the thin film integrated circuit, the first terminal portion, the second terminal portion, and the substrate and for electrically connecting the first terminal portion and the second terminal portion,
wherein the means is a steel wire which is galvanized and wiredrawn.

10. The semiconductor device according to claim 9, wherein the thin film integrated circuit has at least one transistor, and the first terminal portion is electrically connected to the at least one transistor.

11. The semiconductor device according to claim 9, wherein the steel wire is a linear shape conductor, a needle-shaped conductor, or a stick conductor.

12. The semiconductor device according to claim 9, wherein the steel wire penetrates the first terminal portion and the second terminal portion.

* * * * *